United States Patent
Taguwa

(10) Patent No.: US 6,624,582 B2
(45) Date of Patent: Sep. 23, 2003

(54) METHOD OF AN APPARATUS FOR PERFORMING CIRCUIT-PROCESSING, METHOD OF AND APPARATUS FOR CONTROLLING THE MOTION OF THE CIRCUIT-PROCESSING PERFORMANCE APPARATUS, AND INFORMATION STORAGE MEDIUM

(75) Inventor: Tetsuya Taguwa, Tokyo (JP)

(73) Assignee: NEC Electronics Corporation, Kawasaki (JP)

(*) Notice: Subject to any disclaimer, the term of this patent is extended or adjusted under 35 U.S.C. 154(b) by 143 days.

(21) Appl. No.: 09/805,390

(22) Filed: Mar. 13, 2001

(65) Prior Publication Data

US 2002/0009830 A1 Jan. 24, 2002

(30) Foreign Application Priority Data

Mar. 16, 2000 (JP) .......................... 2000-073709

(51) Int. Cl.[7] .............................................. H05B 31/26
(52) U.S. Cl. .................................. 315/111.21; 438/123
(58) Field of Search ................................. 438/123, 710; 315/111.41, 111.81, 111.91, 111.21; 313/362.1, 321.41, 231.4; 219/121 PO, 121 PQ

(56) References Cited

U.S. PATENT DOCUMENTS

| | | | | |
|---|---|---|---|---|
| 4,341,941 A | * | 7/1982 | Tateno | 219/121 |
| 4,423,355 A | * | 12/1983 | Kageyama | 315/111.81 |
| 5,783,492 A | * | 7/1998 | Higuchi et al. | 438/710 |
| 5,985,091 A | * | 11/1999 | Suzuki | 315/111.21 |

FOREIGN PATENT DOCUMENTS

| | | |
|---|---|---|
| JP | 05-021390 | 1/1993 |
| JP | 08-165584 | 6/1996 |
| JP | 08-165585 | 6/1996 |
| JP | 09-064158 | 3/1997 |
| JP | 09-210446 | 8/1997 |
| JP | 09-251935 | 9/1997 |
| JP | 11-061456 | 3/1999 |
| JP | 11-288922 | 10/1999 |

* cited by examiner

Primary Examiner—Don Wong
Assistant Examiner—Jimmy T. Vu
(74) Attorney, Agent, or Firm—Katten Muchin Zavis Rosenman

(57) ABSTRACT

A processed object, i.e., a circuit-constituting member is positioned by a member-transferring unit at a given position in a member-waiting portion when plasma starts to be generated in a plasma-generative portion, and the circuit-constituting member is transferred from the member-waiting portion to the plasma-generative portion when the plasma started to be generated in the plasma-generative portion is brought into a stable condition thereof. Thus, the circuit-constituting member is not subjected to a circuit-processing by plasma before the stable condition is not reached but is surely subjected to the circuit-processing only by plasma in the stable condition.

11 Claims, 14 Drawing Sheets

METHOD OF AN APPARATUS FOR PERFORMING CIRCUIT-PROCESSING, METHOD OF AND APPARATUS FOR CONTROLLING THE MOTION OF THE CIRCUIT-PROCESSING PERFORMANCE APPARATUS, AND INFORMATION STORAGE MEDIUM

BACKGROUND OF THE INVENTION

1. Field of the Invention

The present invention relates to a method of and an apparatus for performing a required circuit-processing or circuit-treatment to produce an electric circuit on a processed object, i.e., a circuit-constituting member due to generation of plasma. The present invention also relates to a method of and an apparatus for controlling a processing motion of the circuit-processing apparatus, and further relates to an information storage medium to store a program as software to be used with a computer for controlling the processing motions of the circuit-processing apparatus.

2. Description of the Related Art

It is well known that diverse kind of integrated circuit devices have recently been employed in a variety of uses. Thus, there have been provided various circuit-processing methods to manufacture these integrated circuit devices having a variety of construction depending on a difference in the uses. Description of an example of the conventional circuit-processing apparatuses for implementing the circuit-processing method will be provided hereinbelow with reference to FIGS. 1 through 10, in which FIG. 1 is a plan view illustrating an entire construction of an example of a circuit-processing system accommodated in the conventional circuit-processing performing apparatus, FIG. 2 is a diagrammatic cross-sectional side view illustrating a transport chamber in which a circuit-constituting member is held to wait for being processed, and a processing chamber, which forms a plasma generative portion, FIG. 3(a) is a cross-sectional elevation view illustrating the stacked construction of an important portion of an LSI (large Scale integration), FIG. 3(b) is a cross-sectional side view of same, FIG. 4(a) through FIG. 5(b) are cross-sectional views illustrating the important portions of the manufacturing steps to manufacture the LSI, and FIGS. 6(a) through 7(c) are cross-sectional views illustrating the important portions of the processing steps to conduct plasma etching treatment constituting the circuit-processing method.

Referring to FIGS. 1 through 7(c), a circuit-processing system 100 constituting an example of the conventional circuit-processing apparatus is provided with a processing apparatus body 101, which is a body portion of the circuit-processing apparatus, and a motion-controlling unit 102 including therein a computing system. The processing apparatus body portion 101 and the motion-controlling unit 102 are operatively connected to one another by a communication network 103.

The processing apparatus body portion 101 is provided with a single transport chamber 110 corresponding to a circuit-constituting member waiting portion. Around the transport chamber 110 there are arranged two first and second load-lock chambers 111 and 112 and four first through fourth processing chambers 113 through 116. The first and second load-lock chambers 111 and 112 are respectively provided with a body housing fluidly connected to an individual vacuum pump via a pipe arrangement. The first and second load-lock chambers 111 and 112 are provided with a pair of gate valves, respectively, which are mounted on the respective body housings so that each of the pair of gate valves is in a fluid communication with both the transport chamber 110 and the exterior of the circuit-processing system, and accordingly the pair of gate valves of each of the first and second load-lock chambers 111 and 112 perform transportation of the processed object (i.e., a circuit-constituting member 200) from and toward the exterior.

As shown in FIG. 2, the transport chamber 110 is also provided with a hollow body housing 120, which is fluidly connected to a vacuum pump 121 via a suitable pipe arrangement. The transport chamber 110 supports thereon a robot arm 122 forming a member transfer means, which can be used for freely transferring a circuit-constituting member 200 to the two lad-lock chambers, 111 and 112 and to the four processing chambers 113 through 116. As also shown in FIG. 2, the first processing chamber 113, which is used as a plasma generating portion is provided with a hollow ceramic-made body housing 123 and is fluidly connected to the transport chamber 110 via a gate valve 124. The hollow body housing 123 of the first processing chamber 110 is connected to a peculiar vacuum pump 125 and a gas cylinder 126 via appropriate pipes.

The body housing 123 of the first processing chamber 113 is provided with a copper-made inductively-coupled plasma coil 127 having a good heat conductivity and mounted around the outer face of the housing 123. The inductively-coupled plasma coil (it will be hereinafter referred to as ICP coil) 127 is electrically connected to a low-frequency ICP power source 128 and a matching box (not shown).

The first processing chamber 113 is further provided with a heating susceptor 129 capable of functioning as a member-holding means for holding a circuit-constituting member thereon is housed in a bottom portion of the body housing 123, and is electrically connected to a high frequency power source, i.e., a radio-frequency power source (RF source) 130 and a matching box (not shown in FIG. 2).

The first processing chamber 113 having the above-described construction is arranged so as to conduct a circuit processing method by which plasma etching is applied to the circuit-constituting member 200. To this end, the vacuum pump 125 is operated so as to maintain the interior of the body housing 123 of the first processing chamber 113 at adjustable vacuum condition, and the gas cylinder 126 is operated so as to introduce gaseous argon and hydrogen gas into the interior of the body housing 123. The ICP power source 128 applies a low-frequency energy having 1.0 KW at 450 KHz to the ICP coil 127. As a result, plasma is generated in the interior of the body housing 123. Therefore, it can be considered that the above-mentioned gas cylinder 126, the ICP coil 127 and the ICP power source 128 corresponds to a plasma generating means. It should be understood that the ICP coil 127 is formed to have a hollow construction therein for permitting a cooling water (not shown) to flow in the interior of the ICP coil 127.

The heating susceptor 129 removably supports thereon the circuit-constituting member 200, and heats the member 200 by means of a built-in heat-generative resistance body to approximately 500 degrees centigrade (500° C.). The high-frequency RF power source 130 impresses high-frequency bias at 13.56 MHz to the heating susceptor 129 to thereby allow the circuit-constituting member 206 to be radiated by the generating plasma.

The second and third processing chambers 114 and 115 are formed to have a construction similar to that of the first processing chamber 113, respectively. Thus, the circuit-constituting members 200 held in the second and third processing chambers 114 and 115 can be subjected to a predetermined circuit processing method, i.e., either a plasma enhanced chemical vapor deposition (CVD) method for depositing a titanium thin film onto the member 200 or a thermal CVD method for depositing a titanium nitride film onto the member 200. The fourth processing chamber 116 is arranged for applying cooling treatment to the circuit-constituting member 200 when it is held therein.

The motion-controlling unit 102 is provided with an information storage medium consisting of a read-only memory (ROM) and a random access memory (RAM), which preliminarily stores an appropriate controlling program in the form of software. The motion-controlling unit 102 is also provided with a central processing unit (CPU), which operates so as to read the program thereby conducting predetermined data processing so that every part of the apparatus body portion 101 is administered and controlled.

In the circuit-processing system 100 having the described construction, the transport chamber 110 appropriately conducts transportation of the circuit-constituting members 200 from the first and second load-lock chambers 111 and 112 toward the first through fourth processing chambers 113 through 116 when the circuit-constituting members 200 are carried into the load-lock chambers 111 and 112 from outside the circuit-processing system 100. The respective processing chambers 113 through 116 are able to conduct diverse kind of processing or treatments to the circuit-constituting members 200. The circuit-constituting members 200 after processing or treatments are transferred from the load-lock chambers 111 and 112 toward outside the circuit-processing system 100.

The described circuit-processing system 100, which is able to conduct diverse kind of processing or treatments, is also able to apply pretreatment to respective contact holes of the circuit-constituting members 200 by plasma etching conducted, for example, within the first processing chamber 113 before metallic electrodes are embedded in the contact holes. For example, in a LSI 201 shown in FIGS. 3(a) and 3(b), a gate electrode 206, a source electrode 207 and a drain electrode 208 are able to be connected to a MOSFET (metal oxide semiconductor field effect transistor) 202 through contact holes 203 through 205, respectively.

More specifically, in the illustrated LSI 201, a gate oxide film 211 of 10 nanometer (nm) thick is formed on a surface of a p type semiconductor substrate 210, and a pair of n type diffused layers 212 and 213 are formed on the opposite sides of the gate oxide film 211. On the surface of the gate oxide film 211, a polycrystalline silicon film 214 and a tungsten silicon film 215 are deposited in a stacked manner to produce the MOSFET 202.

An interlayer dielectric 216 made of a BPSG (borophospho silicate glass) is stacked on the surface of the MOSFET 202, and in the interlayer dielectric 216, the contact hole 203 is formed so as to extend until it reaches the tungsten silicon film 215. Further, the contact holes 204 and 205 are formed in the interlayer dielectric 216 so that the two holes 204 and 206 extend until they reach the pair of n type diffused layers 212 and 213, respectively. Thus, the gate electrode 206 is connected to the MOSFET 202 via the contact hole 203, and the source and drain electrodes 207 and 208 are connected to the same MOSFET 202 via the contact holes 204 and 205. Nevertheless, in the recent LSI 201, the diameters of the contact holes 203 through 205 must be made fine due to high integration, and on the other hand, the entire length of the contact holes 203 through 205 must be increased due to the reason that the diverse kind of circuits are stacked to form a multi layer construction. Namely, the aspect ratio of the contact holes 203 through 205 is extremely increased, and accordingly a good and appropriate formation of the electrodes 206 through 208 in the LSI 201 is made very difficult.

Therefore, in order to obtain a good formation of the electrodes 206 through 208 in the contact holes 203 through 205 having an excessively increased aspect ratio, removal of a damaged layer, which is formed during the pretreatment by plasma etching, as well as removal of a native oxide are carried out.

At this stage, as shown in FIGS. 4(a) and 5(a), in the conventional circuit-processing system 100, a processed object, i.e., a circuit-constituting member 200 consists of an LSI 201 during manufacturing, in which although the contact holes 203 through 206 have been formed in the interlayer dielectric 216, any of the electrodes 206 through 208 has not yet been produced.

As shown in FIGS. 6(a) through 6(c), the above-mentioned circuit-constituting member 200 is supported on the robot arm 122 within the transport chamber 111, and the transport chamber 111 and the first processing chamber 113 are vacuumed by the vacuum pumps 121 and 125 until an equilibrium vacuum condition is established in both chambers 111 and 113. Then, as best shown in FIG. 6(b), the gate valve 124 is opened so as to permit the circuit-constituting member 200 to be transferred by the action of the robot arm 122 from the transport chamber 110 into the first processing chamber 113 in which the circuit-constituting member 200 is placed on and supported by the heating susceptor 129. Subsequently, after the gate valve 124 is closed, the argon of 4.5 sccm and the hydrogen of 1.5 sccm are introduced into the first processing chamber 113, and the circuit-constituting member 200 is heated by the heating susceptor 129 up to 500° C. This heated condition is maintained until a time of approximately 15 seconds has passed. After the time lapse, the interior of the first processing chamber 113 is vacuumed by the vacuum pump 125 to a low-vacuumed condition kept at more than 3.0 mTorr during the introduction of the argon and hydrogen therein. Simultaneously, the ICP coil 127 is supplied with a low frequency power at 450 KHz and at 1.0 KW by the ICP power source 128, so that plasma generates in the interior of the first processing chamber 113, as shown in FIG. 6(c).

The plasma immediately after the start of generation within the first processing chamber 113 is of high density and uneven resulting in an unstable condition. However, when approximately 10 seconds has passed from the start, the generation of plasma becomes even and stabilized in the interior of the first processing chamber 113. Thus, as shown in FIG. 7(a), after stabilizing, the interior of the first processing chamber 113 is further vacuumed by the vacuum pump 125 until a high-vacuumed condition at less than 1.0 mTorr is reached within the interior of the processing chamber 113. Then, a high frequency bias at 250 W is applied to the circuit-constituting member 200 by the RF power source 130 via the heating susceptor 129. Thus, as shown in FIG. 7(b), the plasma acts on the circuit-constituting member 200 so as to apply dry etching onto the member 200, and accordingly the damaged layer on the surface of the contact holes 203 through 205 is removed. This process for the removal of damaged layer lasts for approximately 30 seconds, and thereafter the application of the electric voltage by the RF power source 130 is stopped so as to terminate the plasma etching process. Then, when 1.0 second has further passed, the ICP power source 128 is switched from ON to OFF, and the supply of gas from the gas cylinder 126 is stopped so as to stop the generation of plasma.

Then, when approximately 10 seconds has further passed, the gate valve 124 is opened so that the robot arm 122 transfers the circuit-constituting member 200 from the first processing chamber 113 to the transport chamber 110. Subsequently, one of the circuit-constituting members 200, for example, the one just transferred from the first processing chamber 113 is transferred from the transport chamber 110 to the second processing chamber 114. Therefore, titanium film is deposited onto the surface of the through-hole like contact holes 203 through 205 and other like area by the plasma CVD method.

In the described circuit-processing method carried out by the circuit-processing system 100, the damaged layer formed on the surface of the circuit-constituting member 200 is removed by the pretreatment according to the plasma etching. Thus, the titanium film 217 or the like can be successfully and appropriately deposited onto the inner surface of the through-hole like contact holes 203 through 205 having a high aspect ratio.

In the afore-described circuit-processing method carried out by the circuit-processing system 100, the surface of the circuit-constituting member 200 is subjected to the plasma etching process within the first processing chamber 113 for the purpose of cleaning the inner surface of the contact holes 203 through 205 having a high aspect ratio. Nevertheless, according to an experiment conducted, when the surface of the circuit-constituting member 200 is practically subjected to the plasma etching in the afore-described processing chamber 113 of the circuit-processing system 100, it was found that unignorable damages due to plasma etching appear in various areas in the gate oxide film 211 or other surface portions.

Therefore, the inventors of the present Application tried to practically manufacture test specimens 300 of the circuit-constituting member, and subjected these test specimens 300 to the plasma etching treatment in the processing chamber 113 in order to inspect damages provided thereon. As shown in FIGS. 8 and 9, the test specimens 300 in question are quite similar to the afore-mentioned circuit-constituting member 200 and are provided with contact holes 203 bored so as to extend therethrough to a gate region including the polycrystalline silicon film 214 and the tungsten silicon film 215 provided in the MOSFET 202. The antenna ratio (the entire area of the gate region/an area on the channel region of the gate region) of the respective test specimens 300 was selected to be 800, 100, and 50. It should be noted that the gate oxide film 211 of these test specimens 300 was intentionally formed to be 75 Å in thickness, which is smaller than usual 10 nm in thickness of the gate oxide film 211 of the conventional circuit-constituting member, so as to permit the test specimens 300 to be susceptible to the plasma damage.

The above-mentioned test specimens 300 were formed with test wirings for inspection after the plasma etching treatment, and were supplied with 5.0 electric volts between the test wirings and the silicon substrates 210 of the respective test specimens 300. Then, measurement of electric leak current from each gate oxide film 211 was conducted to inspect an initial withstanding voltage of the respective MOSFET 202 of the test specimens 300. As a result, as shown in FIG. 10, it was confirmed that an unignorable electric leak current appears irrespective of difference in the antenna ratio of the test specimens, and accordingly it was verified that the gate oxide films 211 of the test specimens 300 are subjected to a lot of plasma damage.

SUMMARY OF THE INVENTION

The present invention was made by taking into account the above-described technical background of the circuit processing method and apparatus of the prior art.

Therefore, the present invention aims to achieve at least one of the objects described below. Namely, an object of the present invention is to provide one of a method of and an apparatus for performing circuit-processing, which can prevent appearance of excessive damage even if a circuit-constituting member is subjected to plasma treatment during the processing.

Another object of the present invention is to provide a method of and an apparatus for controlling the motion of the circuit-processing apparatus.

A further object of the present invention is to provide an information storage medium, which is able to store a grogram in the form of software, which is read by an electronic computer controlling the motion of the circuit-processing apparatus.

In accordance with one aspect of the present invention, there is provided a method of performing a predetermined processing for electric circuit on a circuit-constituting member by employing plasma generated by employing a high frequency electric voltage on specified gases introduced into a vacuumized space, which comprises the step of starting the processing of the predetermined processing for electric circuit on the circuit-constituting member when it is confirmed that the plasma is brought into a stable condition thereof after starting of generation of the plasma.

In the above-described method, the predetermined processing for electric circuit on the circuit-constituting member is started when the plasma is brought into a stable condition after the beginning of generation of the plasma. Thus, the circuit-constituting member is not processed by the plasma in an unstable condition thereof, and can be always processed by the plasma in the stable condition.

In accordance with the present invention, the above-described method further comprises the step of detecting a predetermined time lapse after the starting of generation of the plasma to thereby confirm that the stable condition of the plasma is reached. Therefore, the stable condition of the plasma after the beginning of generation of the plasma can be detected by the measurement of the time lapse.

Preferably, the above-described method further comprises the steps of transferring the circuit-constituting member from a first position where the plasma is generated to a second position where the plasma is not generated before the generation of plasma is started, and returning the circuit-constituting member from the second position to the first position when the stable condition of plasma is reached. Thus, the circuit-constituting member is initially retracted from a position where the plasma is generated, and is transferred to the position where the plasma is brought into its stable condition after the beginning of generation of the plasma. Accordingly, the circuit-constituting member is not processed by the plasma in its unstable condition, and can be processed only by the plasma in its stable condition.

Preferably, the above-described method may further comprises the steps of covering the circuit-constituting member against a position where the plasma is generated before the generation of plasma is started, and uncovering the circuit-constituting member to thereby expose the circuit-constituting member to the plasma at the position where the plasma is generated when the stable condition of plasma is reached. Thus, the circuit-constituting member is initially covered against the position where generation of the plasma is started, and is uncovered when the stable condition of the plasma is reached. Accordingly, the circuit-constituting member is not processed by the plasma in its unstable condition, and can be processed by the plasma in its stable condition.

Preferably, the above-described method may further comprises the steps of vacuumizing the first position to a predetermined low vacuum condition before the generation of plasma is started, vacuumizing further the first position to a predetermined high vacuum condition; and implementing the returning of the circuit-constituting member from the second position to the first position at the high vacuum condition. Thus, the position where the plasma is generated is initially held at a low vacuum condition, and therefore, the generation of the plasma can be started smoothly. Thereafter, when the plasma is brought into its stable condition, the position where the plasma is generated is vacuumized to a high vacuum level while permitting the circuit-constituting member to be transferred to the plasma-generated position. Accordingly, the circuit-constituting member can be processed only by the plasma generated in the position kept in the high vacuum level. Namely, the circuit-constituting member cannot be exposed to various noises that might occur together with plasma in a position held in a low vacuum level.

In accordance with another aspect of the present invention, there is provided a method of controlling a motion of a circuit-processing performing apparatus for carrying out a predetermined processing for electric circuit on a circuit-constituting member by employing plasma generated by a plasma-generation means which acts a high frequency electric voltage on specified gases introduced into a vacuum space, which comprises the steps of detecting a stable condition of the plasma by a detecting means when generation of the plasma is started by the plasma generation means; and starting the processing of the predetermined processing for electric circuit on the circuit-constituting member when the detecting means detects that the plasma is brought into a stable condition thereof. Thus, when the motion of the circuit-processing performing apparatus is controlled, the stable condition of plasma after the beginning of generation of the plasma is detected, and the circuit-processing of the circuit-constituting member is started after the detection of the stable condition of plasma. Accordingly, the circuit-constituting member is not processed by the plasma in its unstable condition, and can be processed only by the plasma held in its stable condition.

In accordance with a further aspect of the present invention, there is provided a method of controlling the motion of a circuit-processing performing apparatus including a hollow plasma generative portion in which plasma is generated, a hollow waiting portion for a processed object consisting of a circuit-constituting member, the portion being operatively connected to the plasma generative portion, and a member-transferring means for supporting thereon the circuit-constituting member and for transferring the processed object to each of the waiting portion and the plasma generative portion, the circuit-processing performing apparatus processing the circuit-constituting member by the plasma when the circuit-constituting member is transferred by the member-transferring means from the hollow waiting portion to the plasma generative portion, wherein the controlling method comprises the steps of positioning the circuit-constituting member at the hollow waiting portion when generation of the plasma is started in the plasma generative portion; and transferring the circuit-constituting member from the hollow waiting portion to the plasma generative portion by the member-transferring means when the plasma in the plasma generative portion is brought into a stable condition thereof after the starting of generation of the plasma. Thus, when the motion of the circuit-processing performing apparatus is controlled, the circuit-constituting member is initially retracted from a position where generation of plasma is started, and is transferred to the position where the plasma is generated when the plasma is brought into its stable condition from the beginning of generation of the plasma. Accordingly, the circuit-constituting member is not processed by the plasma in its unstable condition, and can be processed only by the plasma held in its stable condition.

In accordance with a still further aspect of the present invention, there is provided a method of controlling the motion of a circuit-processing performing apparatus including a hollow plasma generative portion in which plasma is generated, a plasma generating means for generating plasma at a first predetermined position in the plasma generative portion, a member-holding means for holding the circuit-constituting member at a predetermined second position opposing the first predetermined position in the plasma generative portion, a member-coverage means for applying removable coverage to the circuit-constituting member between the first predetermined plasma generating position and the second predetermined position where the circuit-constituting member is held by the member-holding means, wherein the controlling method comprises the step of effecting application of the coverage to the circuit-constituting member when generation of the plasma by the plasma generating means is started, and removing the coverage from the circuit-constituting member when the plasma generated by the plasma generating means is brought into a stable condition thereof after the starting of generation of the plasma. Thus, when the motion of the circuit-processing performing is controlled, the circuit-constituting member is initially covered against the position where the plasma is generated, and is uncovered so as to be processed by the plasma when the plasma is brought into a stable condition after the starting of generation of the plasma. Accordingly, the circuit-constituting member is not processed by the plasma in its unstable condition, and can be processed only by the plasma in its stable condition.

In accordance with one aspect of the present invention, there is provided an apparatus for performing a predetermined processing for electric circuit on a circuit-constituting member by employing plasma generated by employing a high frequency electric voltage on specified gases introduced into a vacuumized space, which comprises:

a plasma generating means for generating the plasma;

a stability detecting means for detecting a stable condition of the plasma upon being started to generate by the plasma generating means; and, a processing controlling means for controlling start of the predetermined processing for electric circuit on the circuit-constituting member when the detecting means detects the stable condition of the plasma. Thus, in the circuit-processing method performed by the above-described circuit-processing performing apparatus, when the plasma generating means generates the plasma, the stability detecting means detects the stable condition of the plasma after the starting of generation thereof. Then, after the detection of the stable condition of the plasma by the stability detecting means, the processing controlling means allows the circuit-constituting member to be processed by the plasma. Accordingly, the circuit-constituting member is not processed by the plasma in its unstable condition, and can be processed only by the plasma in its stable condition.

In accordance with another aspect of the present invention, there is provided an apparatus for performing a predetermined processing for electric circuit on a circuit-constituting member by employing plasma generated by employing a high frequency electric voltage on specified gases introduced into a vacuumized space, which comprises:

a plasma generative portion defined to have an interior space thereof in which the plasma is generated;

a hollow member-waiting portion defined to have an interior thereof operatively connected to the plasma generative portion;

a member-transferring means for supporting thereon the circuit-constituting member while permitting the circuit-constituting member to be freely transferred to the member-waiting portion and the plasma generative portion;

a stability detecting means for detecting a stable condition of the plasma upon being started to generate in the plasma generative portion; and, a processing controlling means for permitting the circuit-constituting member to be positioned in the hollow member-waiting portion by the member-transferring means when generation of the plasma is started in the plasma generative portion and for permitting the circuit-constituting member to be transferred from the hollow member-waiting portion to the plasma generative portion by the member-transferring means when stability detecting means detects the stable condition of the plasma. Thus, in the circuit-processing method performed by the above-described circuit-processing performing apparatus, when generation of the plasma is started in the interior of the hollow plasma-generative portion, the member-transferring means controlled by the processing controlling means positions the circuit-constituting member in the member-waiting portion. Then, when the stability detecting means detects the stable condition of the plasma after the starting of generation thereof, the member-transferring means controlled by the processing controlling means transfers the circuit-constituting member from the member-waiting portion to the plasma-generative portion. Accordingly, the circuit-constituting member is not processed by the plasma in its unstable condition, and can be processed only by the plasma in its stable condition.

In accordance with a further aspect of the present invention, there is provided an apparatus for performing a predetermined processing for electric circuit on a circuit-constituting member by employing plasma generated by employing a high frequency electric voltage on specified gases introduced into a vacuumized space, which comprises:

a plasma generative portion defined to have an interior space thereof in which the plasma is generated;

a plasma generating means for generating plasma at a predetermined position in the plasma generative portion;

a member-holding means for holding the circuit-constituting member in the plasma generative portion at a different position opposing the predetermined position where the plasma is generated by the plasma generating means;

a member-coverage means for removably covering the circuit-constituting member between the predetermined position where the plasma is generated by the plasma generating means and the different position where the circuit-constituting member is held by the member-holding means;

a stability detecting means for detecting a stable condition of the plasma upon being started to generate by the plasma generating means; and, a processing controlling means for permitting the circuit-constituting member to be covered by the member-coverage means when the plasma generating means starts to generate the plasma, and for permitting the member-coverage means to remove covering of the circuit-constituting member. Thus, in the circuit-processing method performed by the above-described circuit-processing performing apparatus, the circuit-constituting member held by the member-holding means is disposed in the interior of the hollow plasma-generative portion, and the plasma is generated at the position opposing the position of the circuit-constituting member within the interior of the plasma-generative portion. At this stage, when the plasma generating means starts to generate plasma, the circuit-constituting member is covered by the member-coverage means controlled by the processing controlling means. Thereafter, when the stability detecting means detects the stable condition of the plasma after the starting of generation thereof, the covering of the circuit-constituting member is removed by the member-coverage means. Accordingly, the circuit-constituting member is not processed by the plasma in its unstable condition, and can be processed only by the plasma in its stable condition.

In accordance with the present invention, the aforementioned apparatus comprising the plasma generative portion, the hollow member-waiting portion, the member-transferring means, the stability detecting means, the processing controlling means, may further comprises a vacuum adjusting means for adjustably varying a degree of vacuum prevailing in the plasma generative portion, and wherein the processing controlling means permits the vacuum adjusting means to produce a predetermined low vacuum condition in the plasma generative portion when the plasma starts to be generated in the plasma generative portion, the processing controlling means further permitting the vacuum adjusting means to produce a predetermined high vacuum condition in the plasma generative portion before the circuit-constituting member is transferred to the plasma generative portion when the stable condition of the plasma is reached. Thus, the vacuum adjusting means controlled by the processing controlling means produces the predetermined low vacuum condition in the plasma generative portion when the generation of plasma is started, and produces the predetermined high vacuum condition in the plasma generative portion before the circuit-constituting member is transferred to the plasma generative portion when a predetermined time has passed from the starting of generation of the plasma. Accordingly, the generation of plasma is smoothly started, and the circuit-constituting member is processed only by the plasma generated in the high vacuum portion. Therefore, the circuit-constituting member cannot be exposed to various noises, which might occur together with the plasma in the low vacuum portion.

In the above-described circuit-processing performing apparatus, since the circuit-constituting member may be transferred from the low vacuum member-waiting portion to the high vacuum plasma-generative portion, there is no transfer of an environmental condition from the plasma-generative portion to the member-waiting portion, so that the plasma generated in the plasma-generative portion does not leak therefrom to the member-waiting portion.

Further, in the above-described circuit-processing apparatus, the stability detecting means may be constructed to detect the stable condition of plasma in response to the detection of a predetermined time lapse from the start of generation of plasma, and therefore the stable condition of plasma can be detected only by the measurement of a time.

In one aspect of the present invention, there is provided an apparatus for controlling the motion of a circuit-processing performing apparatus in which a predetermined processing for electric circuit is processed on a circuit-constituting member by plasma generated by employing a high frequency electric voltage on specified gases introduced into a vacuumized space.

The controlling apparatus comprises a stability detecting means for detecting a stable condition of the plasma that has started to be generated, and a processing controlling means for starting the predetermined precession for electric circuit to be processed on the circuit-constituting member after the stability detecting means detects the stable condition of the plasma. In the motion controlling method carried out by the above-described controlling apparatus, the stability detecting means detects the stable condition of plasma that has started to be generated, and when the stable condition of plasma is detected, the processing controlling means starts the predetermined precession for electric circuit to be processed. Accordingly, the circuit-constituting member is not processed by the plasma in its unstable condition, and is processed only by the plasma in its stable condition.

In another aspect of the present invention, there is provided an apparatus for controlling the motion of a circuit-processing performing apparatus provided with a hollow plasma-generative portion defined to have an interior thereof in which plasma is generated, a hollow member-waiting portion defined to have an interior thereof operatively connected to the interior of the plasma-generative portion, and a member-transferring means for supporting thereon a processed object consisting of a circuit-constituting member while permitting the circuit-constituting member to be transferred to the member-waiting portion and the plasma-generative portion, the circuit-constituting member being processed by the plasma when the circuit-constituting member is transferred from the member-waiting portion to the plasma-generative portion.

The controlling apparatus comprises a stability detecting means for detecting a stable condition of the plasma that has started to be generated in the plasma-generative portion, and a processing controlling means for permitting the circuit-constituting member to be positioned by the member-transferring means in the member-waiting portion when the plasma starts to be generated in the plasma-generative portion, and for permitting the circuit-constituting member to be transferred by the member-transferring means from the member-waiting portion to the plasma-generative portion when the stability detecting means detects a stable condition of the plasma.

In the motion controlling method carried out by the above-described controlling apparatus, when the generation of plasma is started in the plasma-generative portion, the circuit-constituting member is disposed in the member-waiting portion by the member-transferring means controlled by the processing controlling means. When the stability detecting means detects the stable condition of plasma that has started to be generated in the plasma-generative portion, the circuit-constituting member is transferred from the member-waiting portion to the plasma-generative portion by the member-transferring means controlled by the processing controlling means. Accordingly, the circuit-constituting member is not processed by the plasma in its unstable condition, and is processed only by the plasma in its stable condition.

In a further aspect of the present invention, there is provided an apparatus for controlling the motion of a circuit-processing performing apparatus provided with a hollow plasma-generative portion defined to have an interior thereof in which plasma is generated, a plasma generating means for generating the plasma at a predetermined position in the hollow plasma-generative portion, a member-holding means for holding the circuit-constituting member in the plasma-generative portion at a position opposing the predetermined position where the plasma is generated by the plasma generating means, and a member-coverage means for removably covering the circuit-constituting member between the predetermined position where the plasma is generated by the plasma generating means and the position where the member-holding means holds the circuit-constituting member, the circuit-processing performing apparatus processing the circuit-constituting member by the plasma.

The controlling apparatus comprises a stability detecting means for detecting a stable condition of the plasma that has started to be generated by the plasma generating means, and a processing controlling means for permitting the member-coverage means to cover the circuit-constituting member when the plasma generating means starts to generate the plasma, and for permitting the member-coverage means to remove covering from the circuit-constituting member when the stability detecting means detects the stable condition of the plasma.

In the motion controlling method carried out by the motion controlling apparatus, when the plasma generating means starts to generate plasma, the circuit-constituting member is covered by the member-coverage means controlled by the processing controlling means. Then, when the stability detecting means detects the stable condition of plasma that has started to be generated by the plasma generating means, the covering of the circuit-constituting member is removed by the member-coverage means controlled by the processing controlling means. Thus, the circuit-constituting member is not processed by the plasma in its unstable condition, and is processed only by the plasma in its stable condition.

It should here be noted that the diverse means for carrying out various functions according to the present invention might be formed in any type of construction capable of executing or implementing a required function. Thus, for example, a dedicated hardware capable of exhibiting a predetermined function, an electronic computer having a predetermined function provided by program, a predetermined function accomplished by a program in an electronic computer, and some possible combinations of these three measures might be permitted for constituting the diverse functioning means.

In accordance with one aspect of the present invention, there is provided an information storage medium for storing software freely read by an electronic computer that controls the motion of a circuit-processing performing apparatus in which a predetermined processing for electric circuit is processed on a circuit-constituting member by plasma generated by employing a high frequency electric voltage on specified gases introduced into a vacuumized space. The information storage medium stores a program for being executed by the electronic computer to thereby start processing of the predetermined processing for electric circuit on the circuit-constituting member after the plasma that has started to be generated is brought into a stable condition.

When the program stored by the above-described information storage medium is read by the electronic computer to execute the associated circuit-processing operation, the electronic computer controls the motion of the circuit-processing performing apparatus. Therefore, the circuit-processing performing apparatus controlled by the electronic computer starts to perform the precession for electric circuit when the plasma that has started to be generated is brought into its stable condition. Accordingly, the circuit-constituting member is not processed by the plasma in its unstable condition, and is processed only by the plasma in its stable condition.

In accordance with another aspect of the present invention, there is provided an information storage medium for storing software freely read by an electronic computer that controls the motion of a circuit-processing performing apparatus provided with a hollow plasma-generative portion defined to have an interior thereof in which plasma is generated, a hollow member-waiting portion defined to have an interior thereof operatively connected to the interior of the plasma-generative portion, and a member-transferring means for supporting thereon a processed object consisting of a circuit-constituting member while permitting the circuit-constituting member to be freely transferred to the member-waiting portion and the plasma-generative portion, the circuit-constituting member being processed by the plasma when the circuit-constituting member is transferred from the member-waiting portion to the plasma-generative portion.

The above-described information storage medium stores a program for being executed by the electronic computer thereby permitting the member-transferring means to position the circuit-constituting member in the member-waiting portion when the plasma starts to be generated in the plasma-generative portion, and to transfer the circuit-constituting member from the member-waiting portion to the plasma-generative portion when the plasma that has started to be generated is brought into a stable condition thereof.

When the program stored by the above-described information storage medium is read by the electronic computer to execute the associated circuit-processing operation, the electronic computer controls the motion of the circuit-processing performing apparatus. Therefore, the circuit-processing performing apparatus controlled by the electronic computer permits the member-transferring means to position the circuit-constituting member in the member-waiting portion when the plasma starts to be generated in the plasma-generative portion, and further permits the member-transferring means to transfer the circuit-constituting member from the member-waiting portion to the plasma-generative portion when the plasma that has started to be generated is brought into its stable condition. Accordingly, the circuit-constituting member is not processed by the plasma in its unstable condition, and can be processed only by the plasma in its stable condition.

In accordance with a further aspect of the present invention, there is provided an information storage medium for storing software freely read by an electronic computer that controls the motion of a circuit-processing performing apparatus provided with a hollow plasma-generative portion defined to have an interior thereof in which plasma is generated, a plasma generating means for generating the plasma at a predetermined position in the hollow plasma-generative portion, a member-holding means for holding the circuit-constituting member in the plasma-generative portion at a position opposing the predetermined position where the plasma is generated by the plasma generating means, and a member-coverage means for removably covering the circuit-constituting member between the predetermined position where the plasma is generated by the plasma generating means and the position where the member-holding means holds the circuit-constituting member, the circuit-processing performing apparatus processing the circuit-constituting member by the plasma.

The above-described information storage medium stores a program for being executed by the electronic computer thereby permitting the member-coverage means to cover the circuit-constituting member when the plasma generating means starts to generate the plasma, and to remove covering from the circuit-constituting member when the plasma that has started to be generated by the plasma generating means is brought into a stable condition thereof.

When the program stored by the above-described information storage medium is read by the electronic computer to execute the associated circuit-processing operation, the electronic computer controls the motion of the circuit-processing performing apparatus. Therefore, the circuit-processing performing apparatus controlled by the electronic computer permits the member-coverage means to cover the circuit-constituting member when the plasma starts to be generated by the plasma generating means, and to remove the covering of the circuit-constituting member when the plasma that has started to be generated by the plasma generating means is brought into its stable condition. Accordingly, the circuit-constituting member is not processed by the plasma in its unstable condition, and can be processed only by the plasma in its stable condition.

It should here be noted that the information storage medium according to the present invention could be any type of hardware in which a program in the form of software permitting an electronic computer to execute diverse kinds of processing is preliminarily stored. Thus, for example, a ROM (a read only memory) and a HDD (a hard disc drive) which might be fixedly accommodated in an apparatus having therein an electronic computer as a part thereof, and a CD-ROM (a compact disc type read only memory) and a FD (floppy disc) which might be removably set in an apparatus having therein an electronic computer as a part thereof could be adopted as the above-mentioned information storage medium.

It should further be noted that the electronic computer according to the present invention might be any apparatus, which functions to read a program in the form of software and to execute the associated processing operation. Therefore, for example, an apparatus accommodating therein a CPU as a main unit to which various devices such as ROM, RAM, I/F (an interface) and so forth are operatively connected could be adopted as the above-mentioned electronic computer.

In the present invention, allowing the electronic computer to execute various kinds of processing operations associated with software might be allowing the computer to control the motion of the above-mentioned various devices. For example, storing various data in the electronic computer as stored data might include storing various date in an information storage medium such as a RAM preliminarily connected to the electronic computer, storing various data in a built-in memory accommodated in the electronic computer as a part thereof, and storing various date in a FD by the electronic computer when the FD corresponds to the information storage medium according to the present invention.

The above-described and other objects, features and advantages of the present invention will be made more apparent from the ensuing description of preferred embodiments thereof, with reference to the accompanying drawings.

DETAILED DESCRIPTION OF THE PREFERRED EMBODIMENTS

Figure 1:
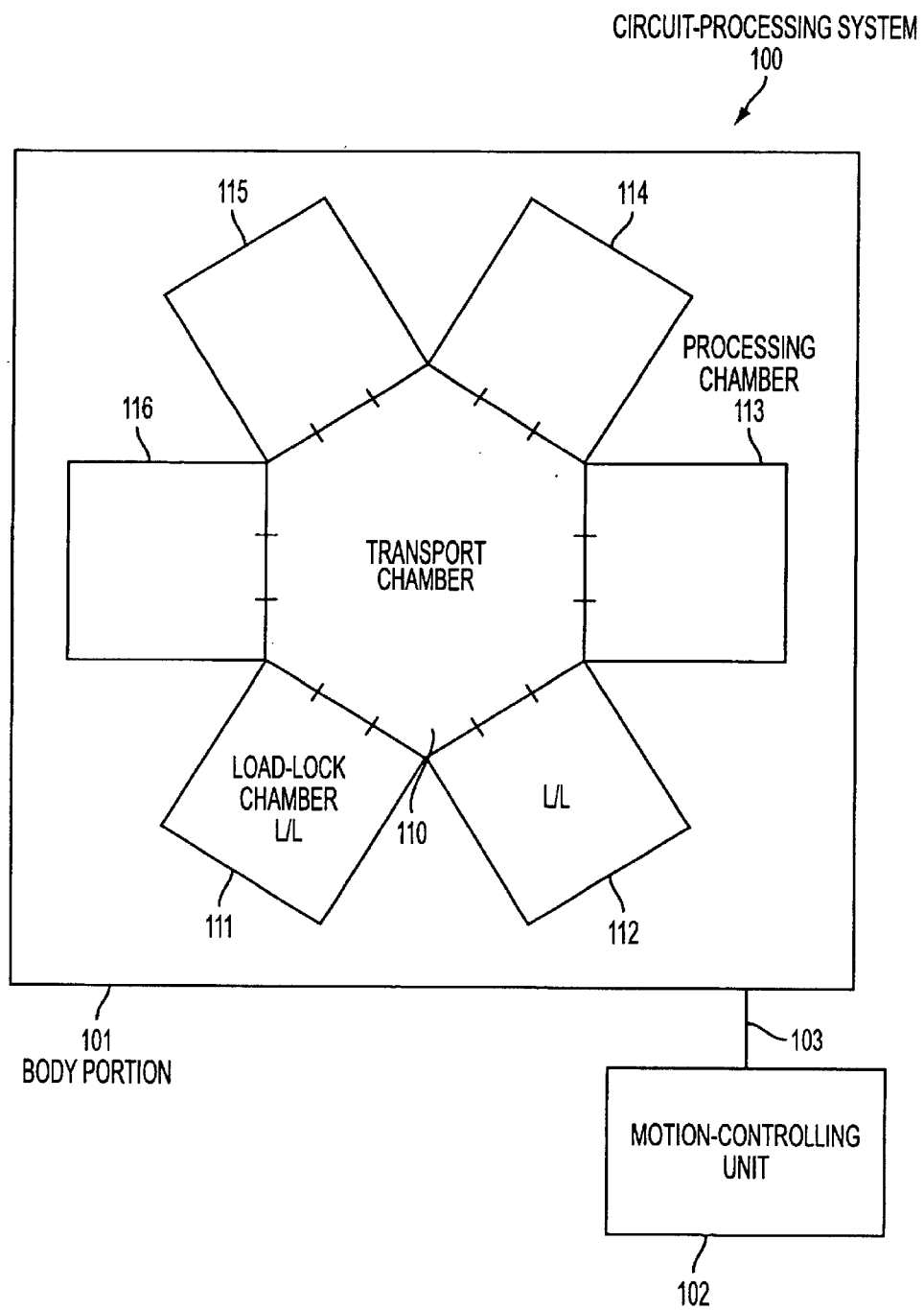
FIG. 1 a diagrammatic plan view of the entire construction of an circuit-processing system, illustrating an example of an circuit-processing performing apparatus according to the prior art.
Figure 2:
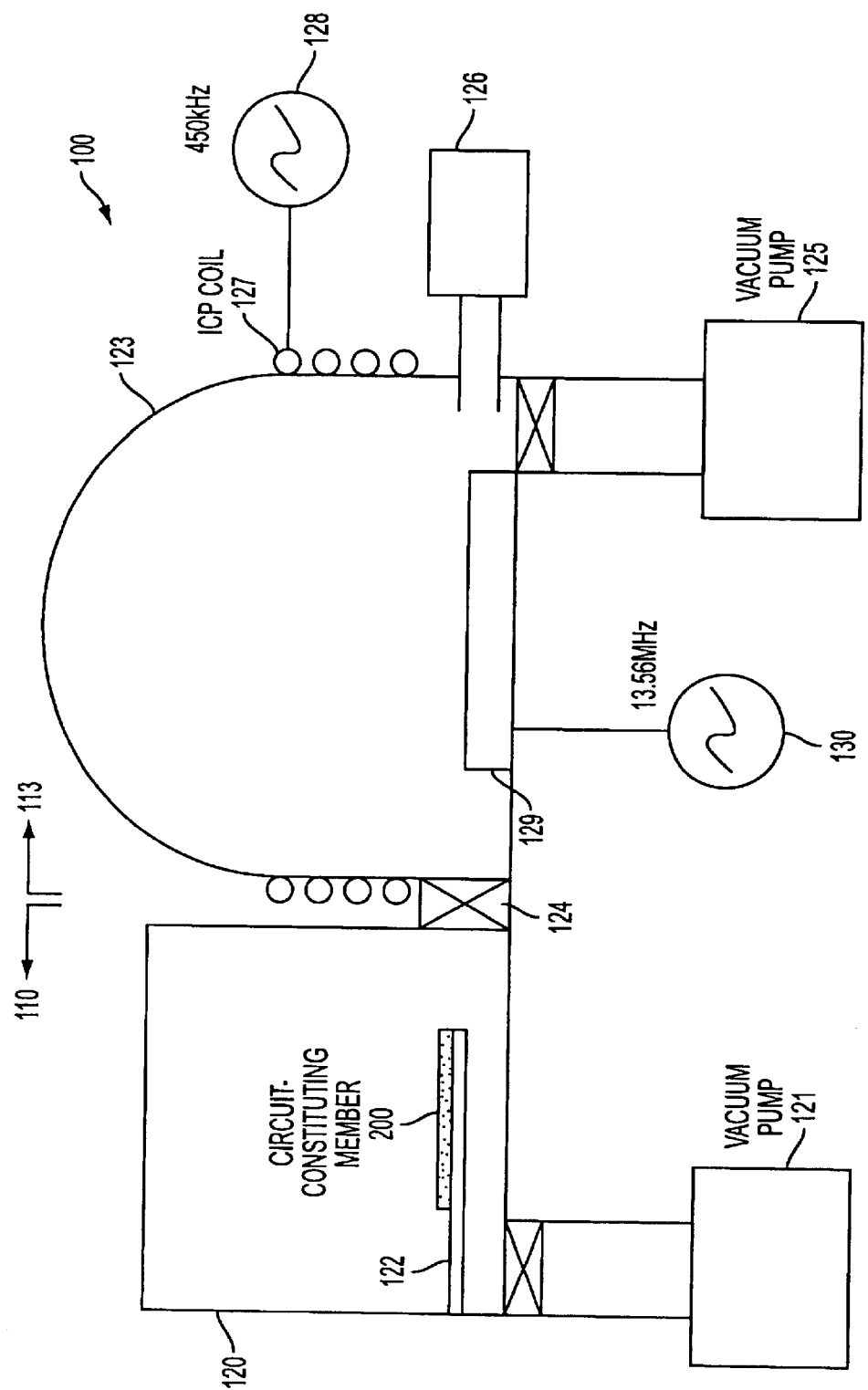
FIG. 2 is a diagrammatic cross-sectional side view illustrating a transport chamber in which a circuit-constituting member is held to wait for being processed, and a processing chamber, which forms a plasma-generative portion.
Figure 3A:
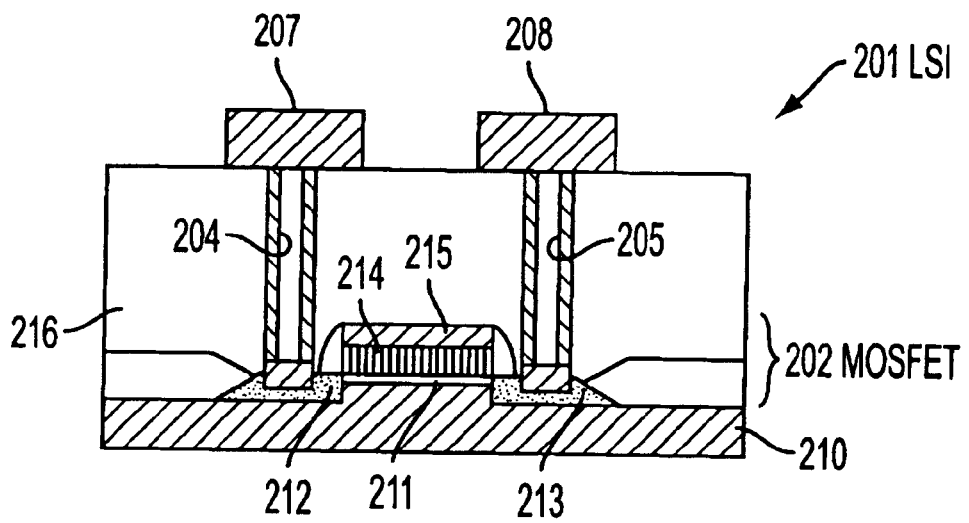
FIGS. 3(a) and 3(b) is cross-sectional elevation and side views illustrating the stacked construction of an important portion of an LSI (Large Scale Integration)
Figure 3B:
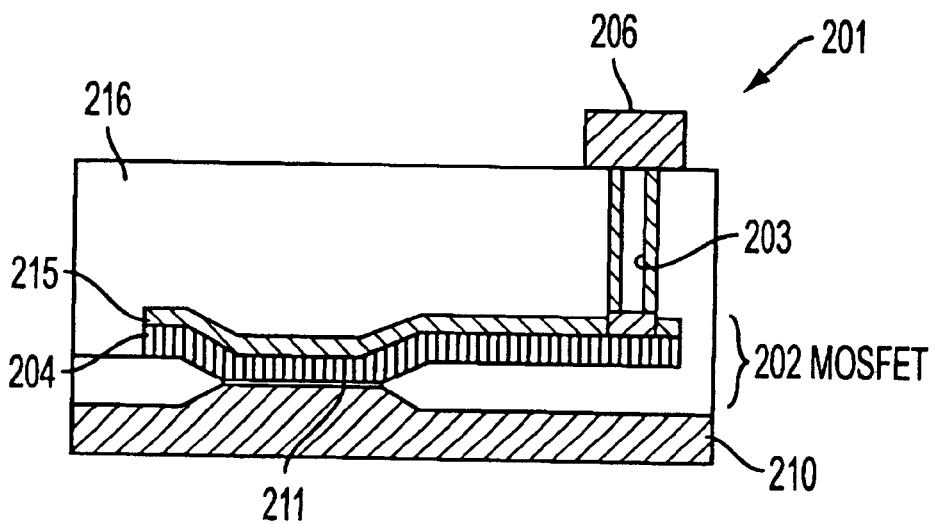
Figure 4A:
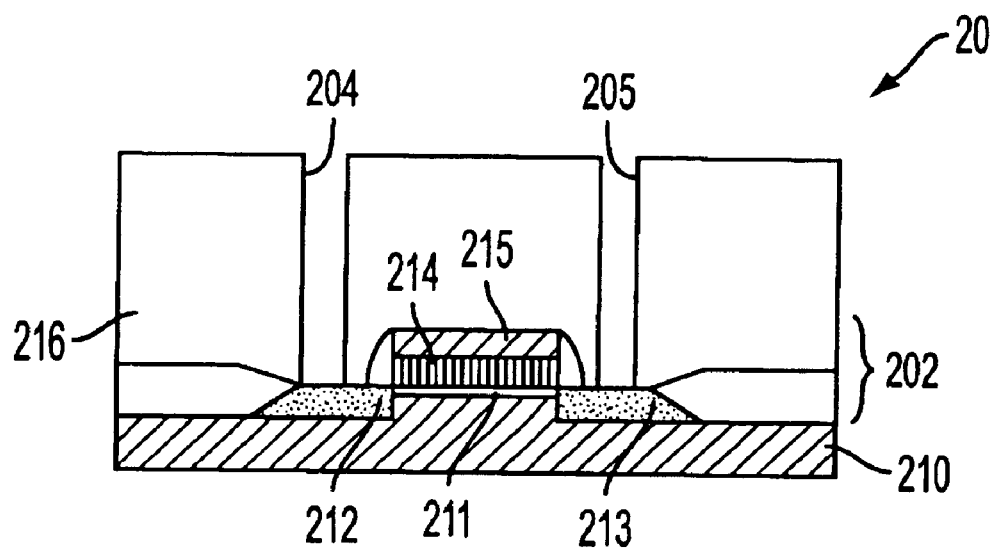
FIGS. 4(a) and 4(b) are cross-sectional views illustrating an important portion of the manufacturing steps to manufacture the LSI.
Figure 4B:
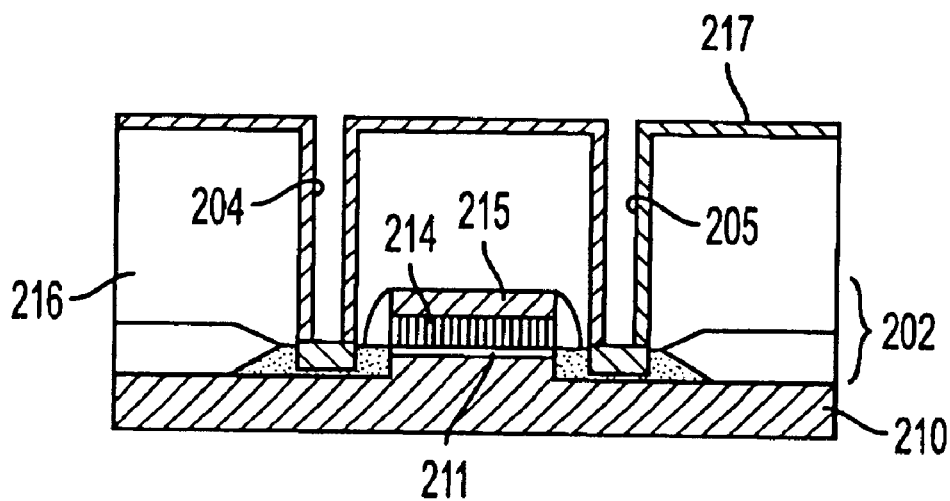
Figure 5A:
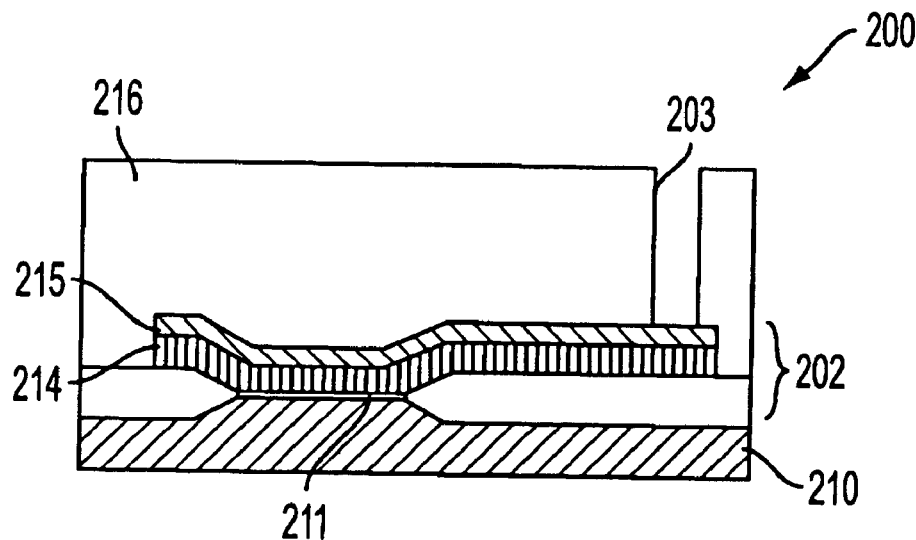
FIGS. 5(a) and 5(b) are cross-sectional views illustrating an important portion of the manufacturing steps to manufacture the LSI.
Figure 5B:
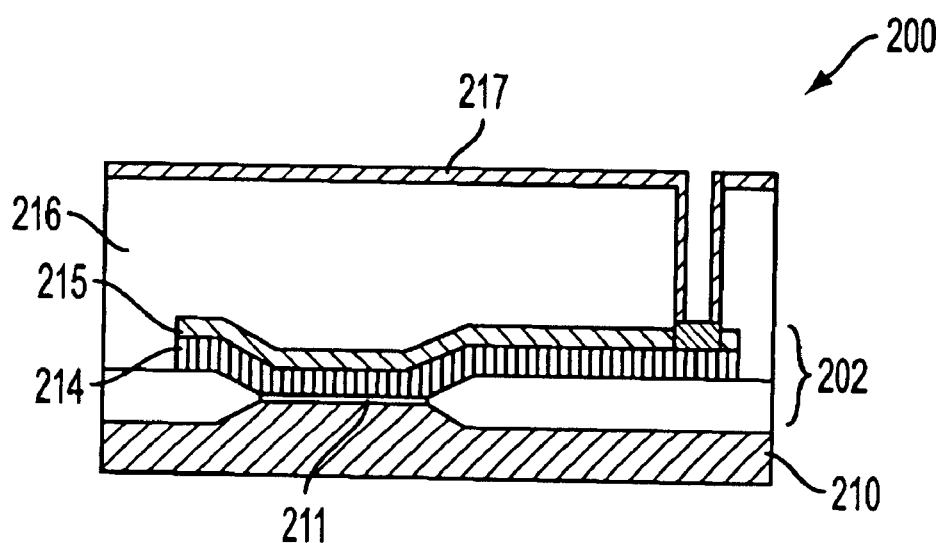
Figure 6A:
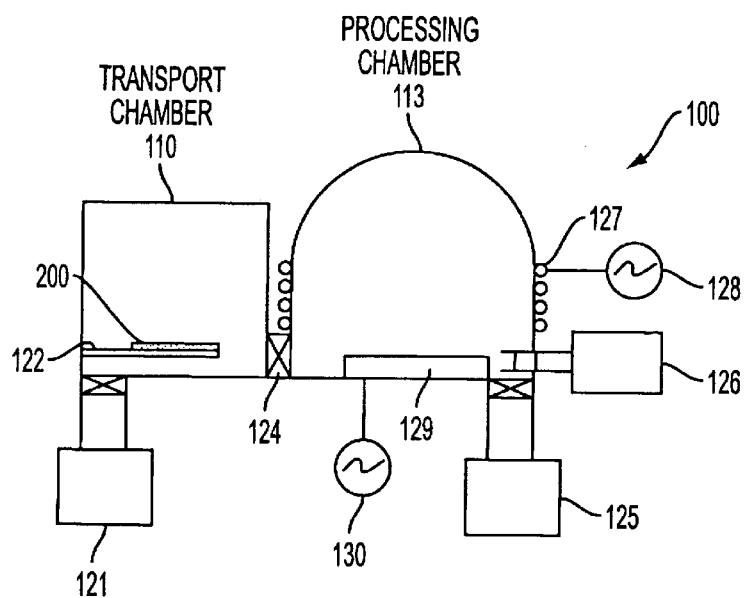
FIGS. 6(a) through 6(c) are schematic views illustrating the front half portion of the processing steps to conduct plasma-etching treatment constituting the circuit-processing performing method.
Figure 6B:
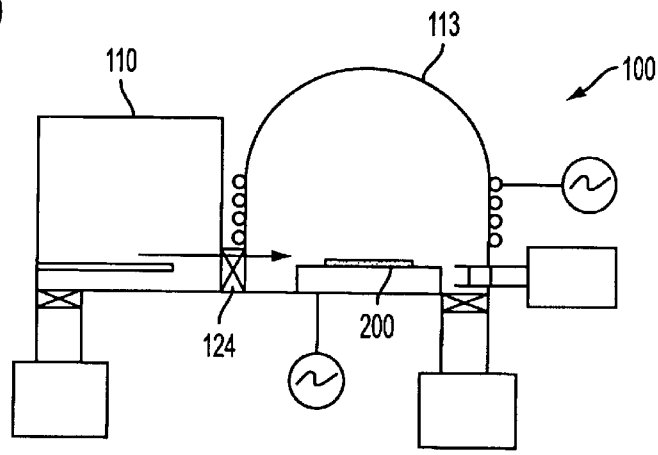
Figure 6C:
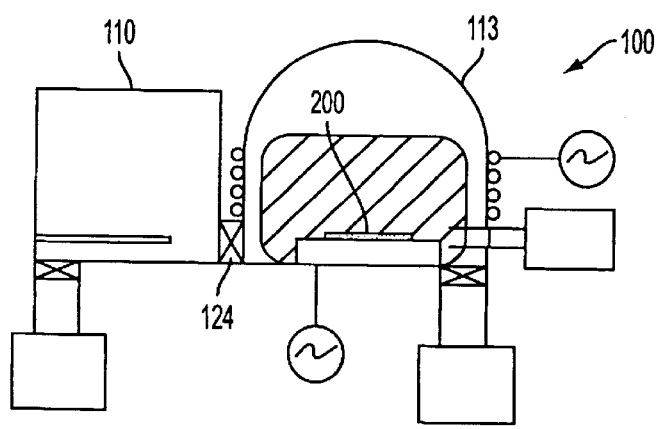
Figure 7A:
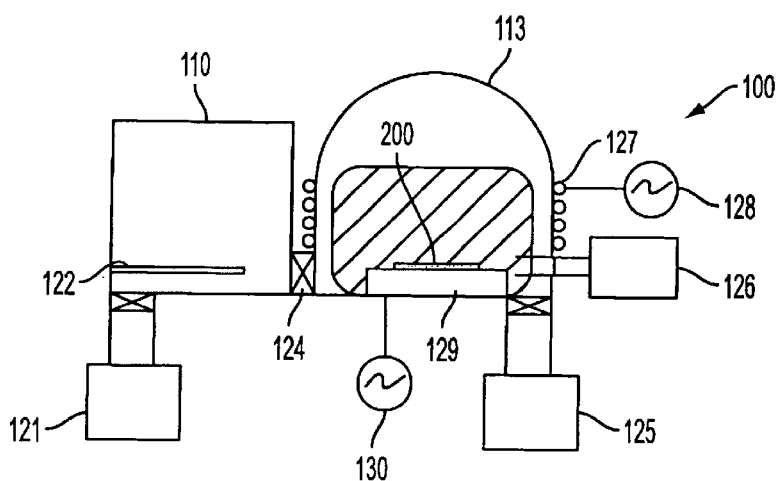
FIGS. 7(a) through 7(c) are schematic views illustrating the rear half portion of the processing steps to conduct plasma-etching treatment constituting the circuit-processing performing method.
Figure 7B:
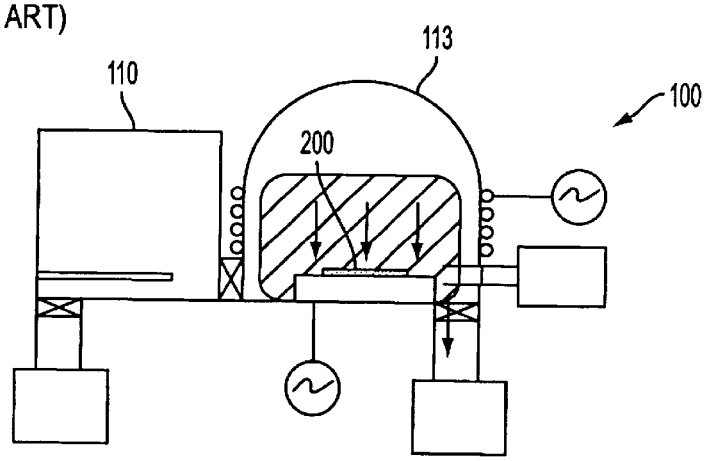
Figure 7C:
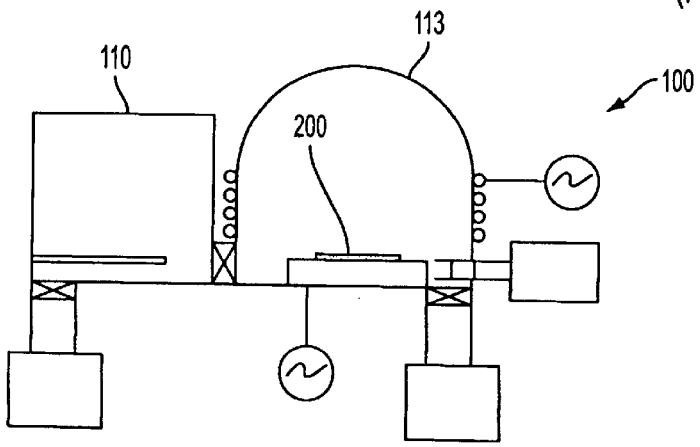
Figure 8:
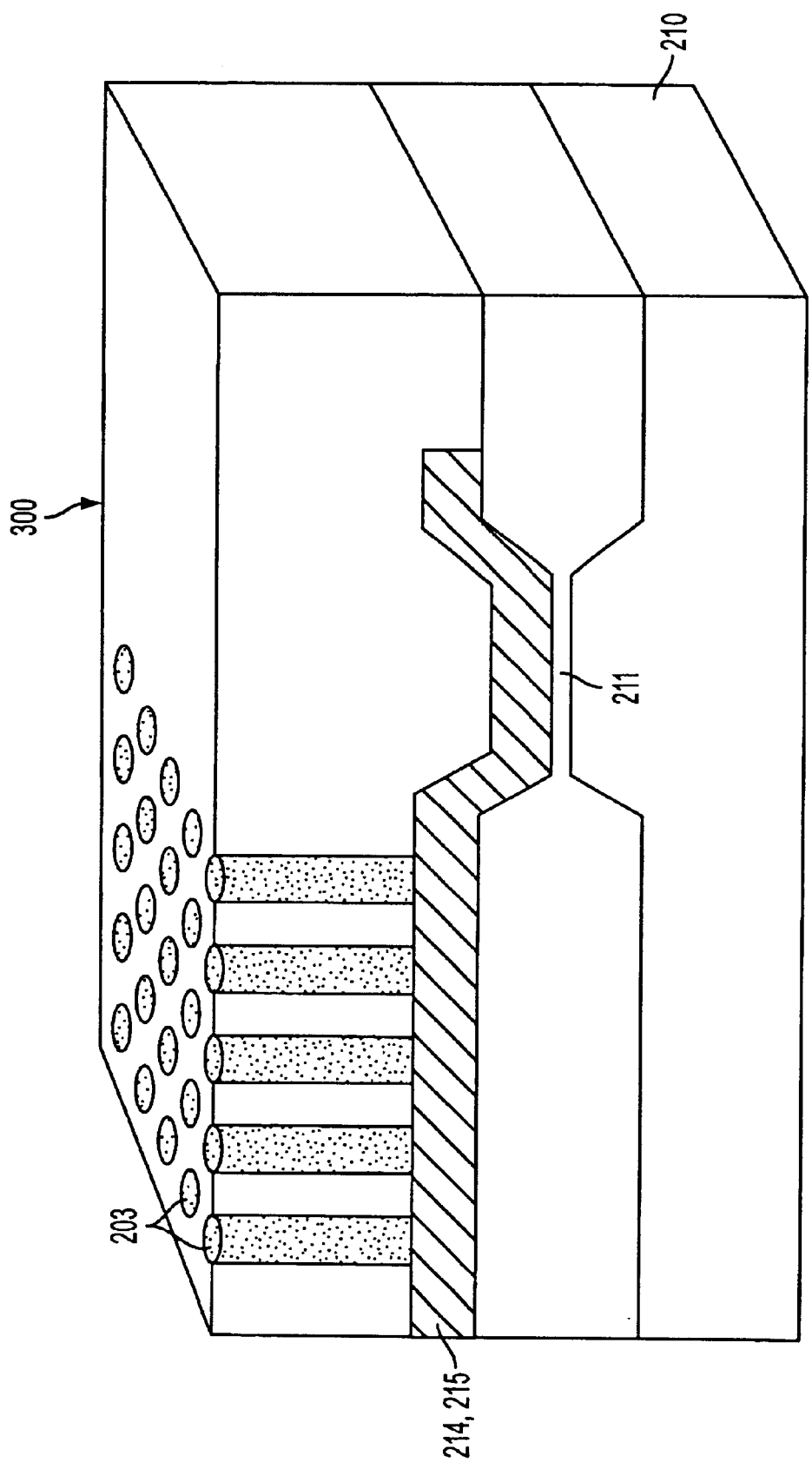
FIG. 8 is a perspective view, in part cross-section, of the entire construction of a test specimen subjected to an inspecting test of plasma damages.
Figure 9:
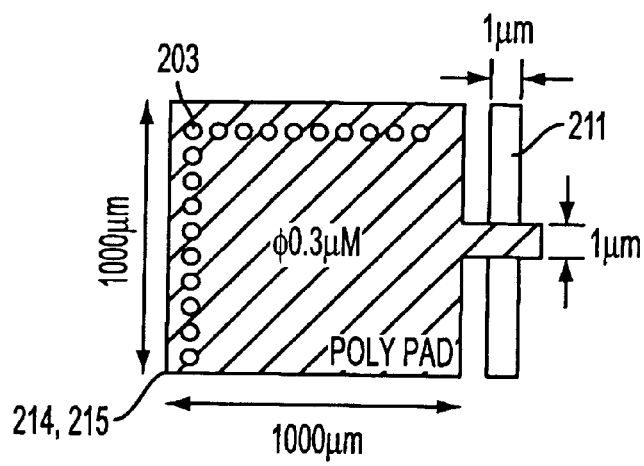
FIG. 9 is a plan view of the important portion of the test specimen, illustrating the construction thereof.
Figure 10:
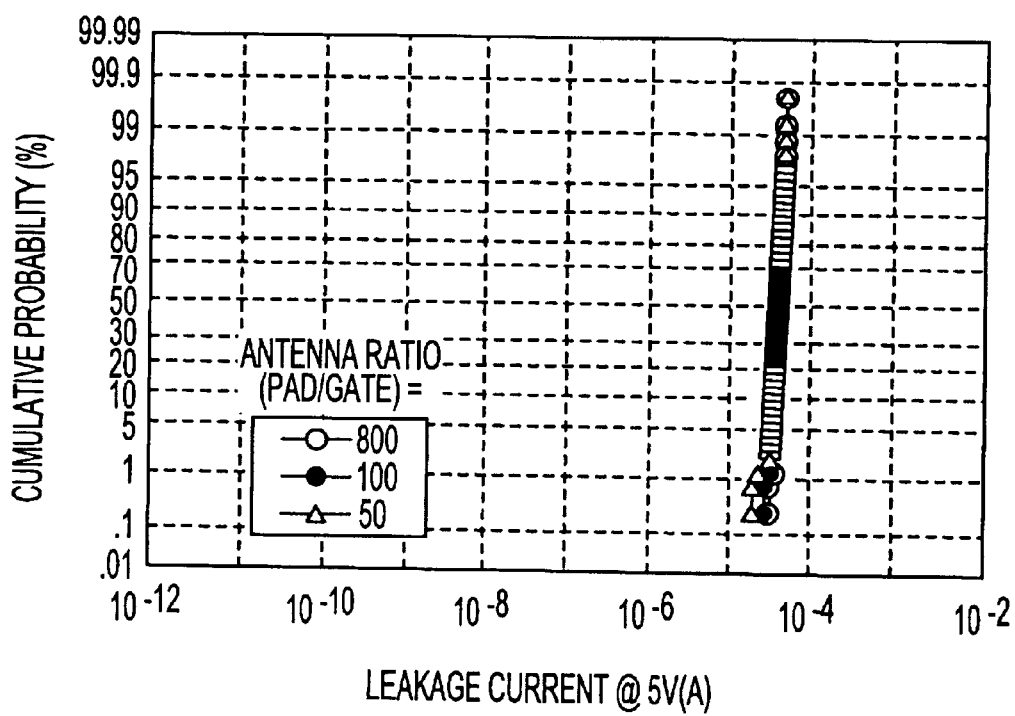
FIG. 10 is a graphical view illustrating the result of the inspection test of the plasma damages.

The description of an embodiment of the present invention is provided hereinbelow with reference to FIGS. 11 through 14. At this stage, in the embodiments of the present invention, same and like parts as those of the afore-described example of the prior art are identified by the same names and reference numerals, and detailed description thereof is omitted for the brevity sake.

Referring to FIGS. 11 through 14, a circuit-processing system 400, which is a circuit-processing performing apparatus according to an embodiment of the present invention, has a hardware construction identical with that of the afore-described circuit-processing system 100 of the prior art. Thus, the circuit-processing system 400 includes an apparatus body portion 101 forming a main body of the circuit-processing system 400, and a motion-controlling unit 401 consisting of an electronic computer which are operatively connected to one another by means of a communication network 103. However, in the circuit-processing system 400 of the present embodiment, the content of a program, which is stored in an information storage medium such as a RAM and a ROM of the motion-controlling unit 401 in the form of software is different from that employed in the afore-described circuit-processing system 100 of the prior art. Therefore, the controlling operation carried out by the motion-controlling unit 401 to control the motion of the apparatus body portion 101 has a content which is obviously different from that of the motion-controlling unit 102 of the prior art. The motion-controlling unit 401 according to the present embodiment is constructed by a so-called electronic computer system, and accordingly includes therein, as a main hardware of the computer, a CPU to which various other hardware units (not shown) such as a ROM, a RAM, a HDD, a FDD (FD drive) in which a FDD is mounted to be driven, a CD drive in which a CD-ROM is mounted to be driven, a keyboard, a display unit, and a communication I/F are operatively connected. In the motion-controlling unit 401 of the present embodiment, the hardware units such as the ROM, the RAM, the HDD, the FD, and the CD-ROM correspond to an information storage medium, and at least one of these hardware units is used for storing, in the form of software, a control program and a variety of data which are necessary for various motions and operations.

For example, a control program allowing the CPU to execute a variety of processing-motions is preliminarily stored in the FD and the CD-ROM. This kind of software is preliminarily installed in the HDD and is reproduced onto the RAM upon starting of operation of the motion-controlling unit 401 to be read by the CPU. Thus, since the CPU reads appropriate program necessary for executing the various processing motions, the motion-controlling unit 401 of the circuit-processing system 400 logically achieves a variety of functions able to operate as a stability detecting means, a processing-controlling means, a vacuum adjusting means and so forth. Therefore, the motion-controlling unit 401 detects a stable condition of plasma that has started to be generated in the first processing chamber 113 of the apparatus body portion 101 when a circuit-constituting member 200 is subjected to plasma etching treatment in the first processing chamber 113. Then, when the stable condition of plasma is detected, the plasma etching treatment provided on the circuit-constituting member 200 within the first processing chamber 113 is started.

More specifically, the motion-controlling unit 401 of the circuit-processing system 400 controls the motions of the robot arm 122 and the gate valve 124 of the apparatus body portion 101, so that the circuit-constituting member 200 is positioned in the transport chamber 110 when the generation of plasma is started in the first processing chamber 113, and that the circuit-constituting member 200 is transferred to the first processing chamber 113 when a predetermined time, e.g., twelve seconds has passed since the start of generation of plasma.

The motion-controlling unit 401 of the circuit-processing system 400 according to the present embodiment further controls the motion of the vacuum pump 125 of the apparatus body portion 101 so as to adjustably change a vacuum level in the first processing chamber 113 until the interior of the first processing chamber 113 is vacuumized to a low vacuum level more than 3.0 mTorr when the generation of plasma is started. Thereafter, when a predetermined time, e.g., 10 seconds has passed since the start of generation of plasma, the first processing chamber 113 is vacuumized to a high vacuum level less than 1.0 mTorr before the circuit-constituting member 200 is transferred to the first processing chamber 113.

It should be understood that the software which allows the motion-controlling unit 401 to perform the various controlling operations are preliminarily described so as to permit the apparatus body portion 101 to implement motions that include positioning the circuit-constituting member 200 in the transport chamber 110 when the generation of plasma starts in the first processing chamber 113, and transferring the circuit-constituting member 200 to the first processing chamber 113 after the predetermined time lapse since the start of generation of plasma in the first processing chamber.

In the above-described construction and arrangement, like the afore-mentioned circuit-processing system 100 of the prior art, the circuit-processing system 400 according to the present embodiment is arranged so that each circuit-constituting member 200 may be appropriately transferred by the transport chamber 110 to one of the first through fourth processing chambers 113 through 116. The circuit-constituting member 200 transferred to these processing chambers 113 through 116 can be subjected to various kinds of processings to produce thereon an electric circuit or circuits. Thus, in the first processing chamber 113, the circuit-constituting member 200 can be subjected to a pre-treatment producing contact holes 203 through 205 in the circuit-constituting member 200 by plasma etching treatment.

Figure 11A:
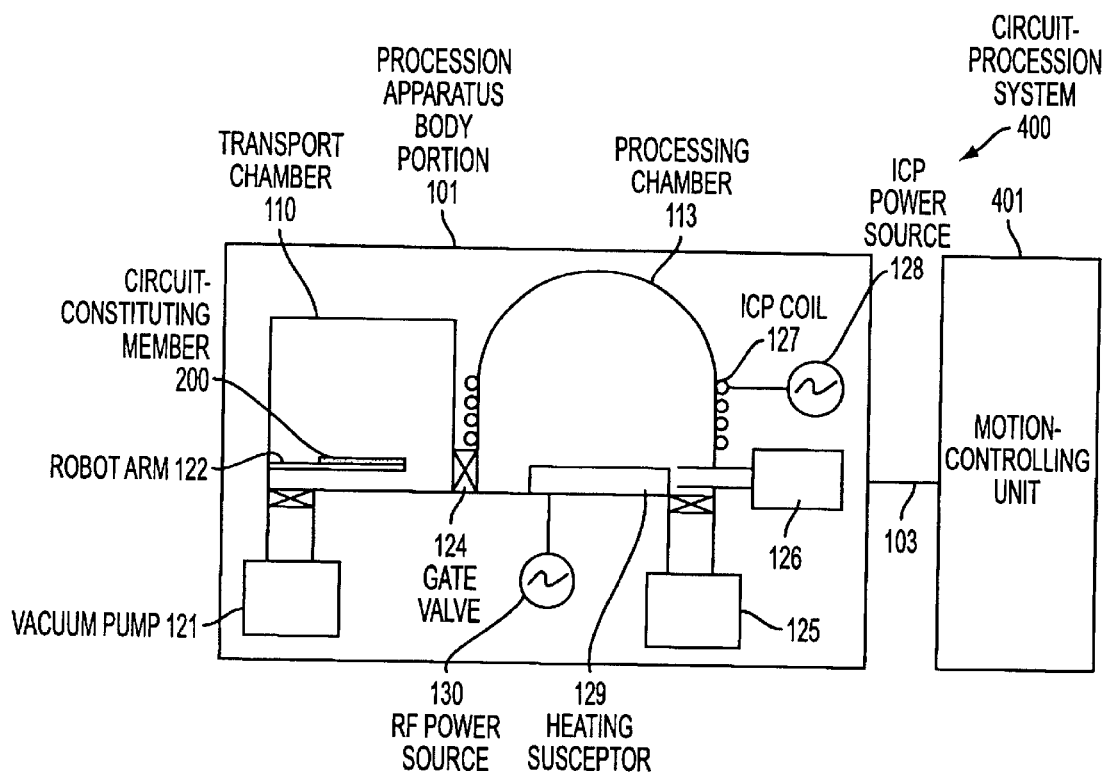
FIGS. 11(a) through 11(c) are schematic views illustrating the front half portion of the processing steps to conduct plasma-etching that is an circuit-processing performing method carried out by a circuit-processing system that is a circuit-processing performing apparatus according to an embodiment of the present invention.
Figure 11B:
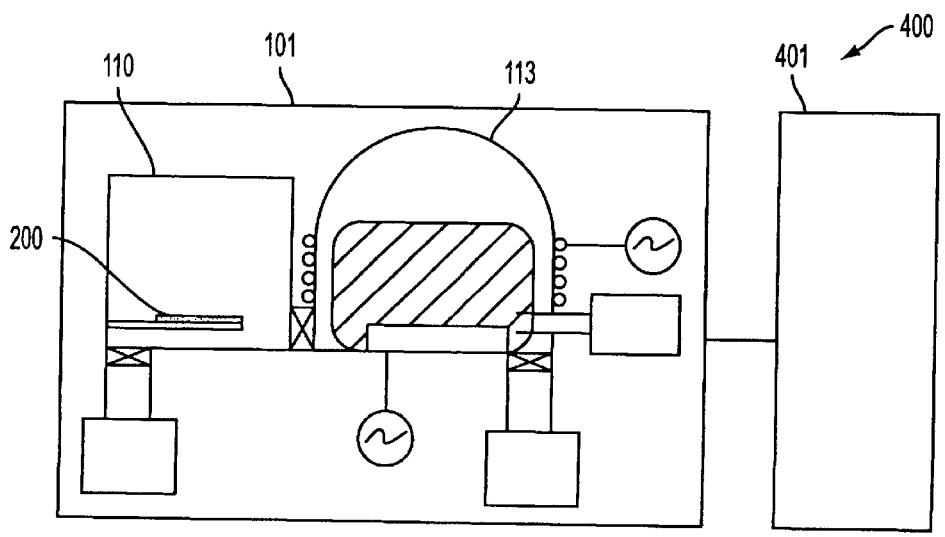
Figure 13:
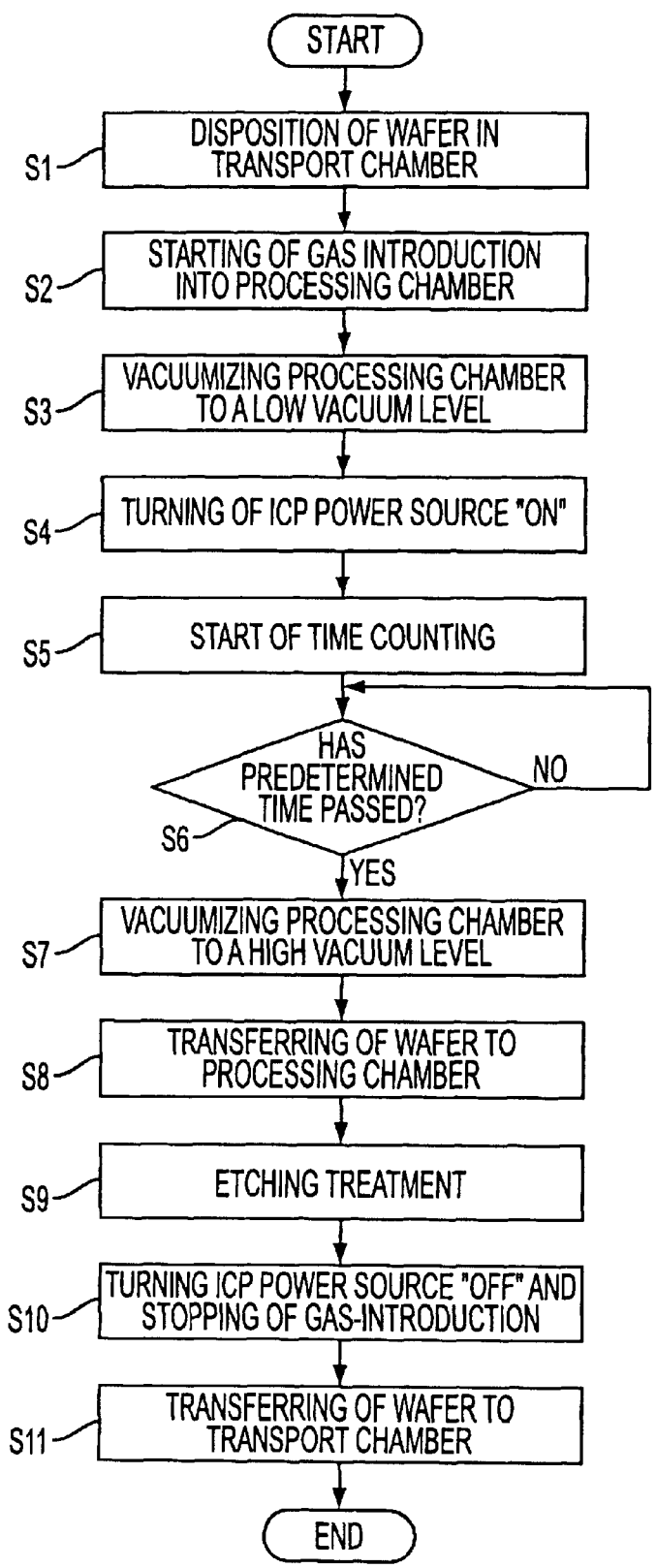
FIG. 13 is a flowchart indicating the circuit-processing performing method.

To this end, as best shown in FIGS. 11(a) and 13, under a condition such that the gate valve 124 providing a communication between the transport chamber 110 and the first processing chamber 113 is closed, the circuit-constituting member 200 is held by the robot arm 122 in the transport chamber 110 (step S1). In this condition, as shown in FIG. 11(b), argon of 4.5 sccm and hydrogen of 1.5 sccm are introduced from the gas cylinder 126 into the interior of the first processing chamber 113 (step S2), and the interior of the first processing chamber 113 is vacuumized by the vacuum pump 125 to a low vacuum level more than 3.0 mTorr (step S3).

Figure 11C:
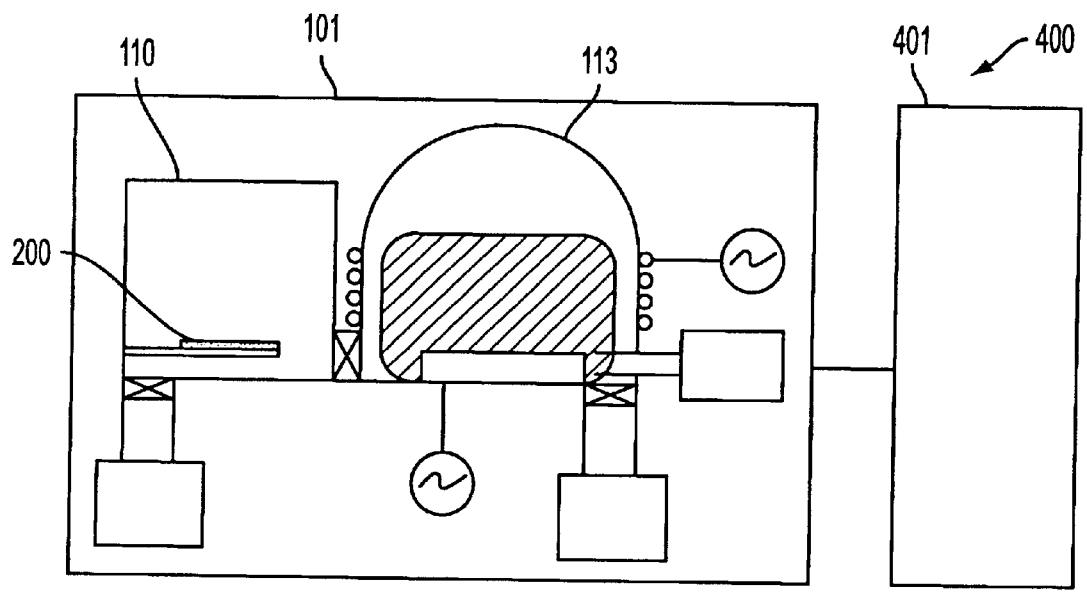
Figure 12A:
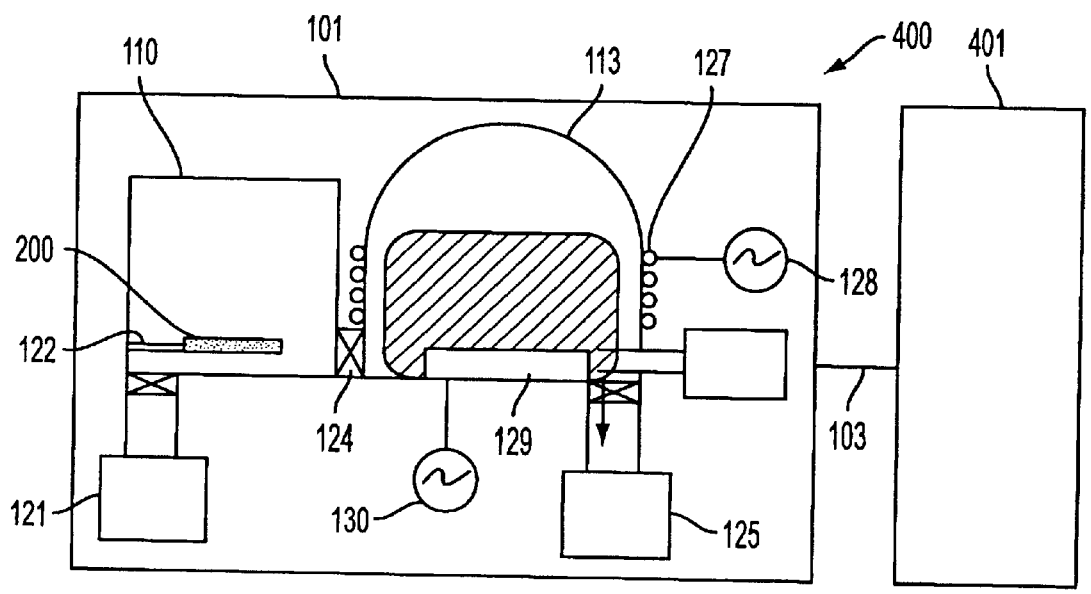
FIGS. 12(a) through 12(c) are schematic views illustrating the rear half portion of the same processing steps.

When the interior of the first processing chamber 113 is vacuumized to a predetermined vacuum level, a low frequency electric power at 1.0 KW is impressed into the ICP coil 127 by the ICP power source 128 (step S4), and therefore plasma is generated in the interior of the processing chamber 113, as shown in FIG. 11(c). As soon as the plasma starts to be generated in the interior of the first processing chamber 113, the motion-controlling unit 401 begins counting of time (step S5), and when lapse of 10 seconds is counted (step S6), the interior of the processing chamber 113 is further vacuumized to a high vacuum level less than 1.0 mTorr (step S7), as shown in FIG. 12(a).

Figure 12B:
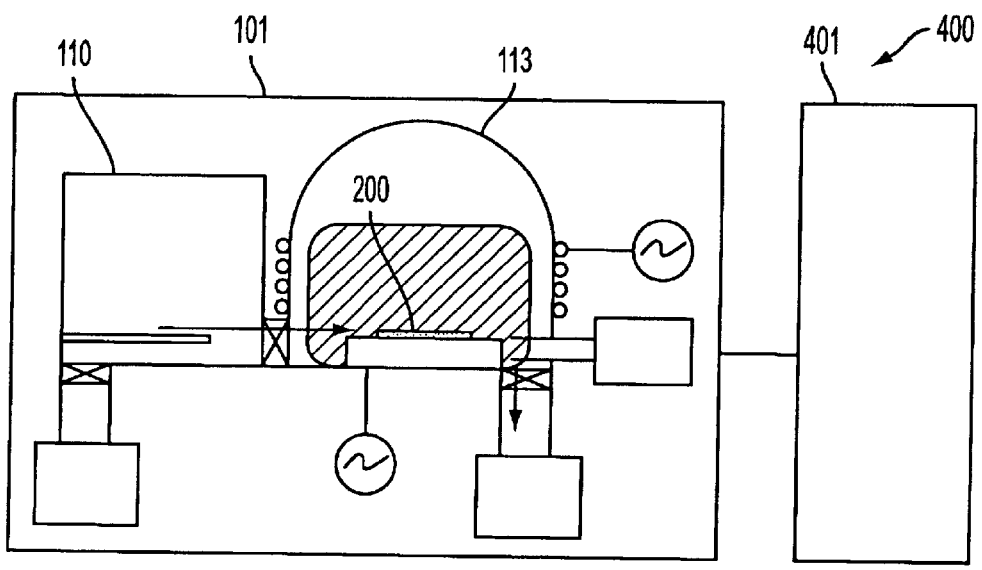

At this time, the transport chamber 110 is also vacuumized to the same vacuum level as the processing chamber 113 by means of the vacuum pump 121. Thereafter, a predetermined time, e.g., 12 seconds has passed from the start of generation of plasma, the gate valve 124 is opened, as shown in FIG. 12(b), so that the circuit-constituting member 200 is transferred by the robot arm 122 from the transport chamber 110 onto the heating susceptor 129 in the first processing chamber 113 (step S8).

Figure 12C:
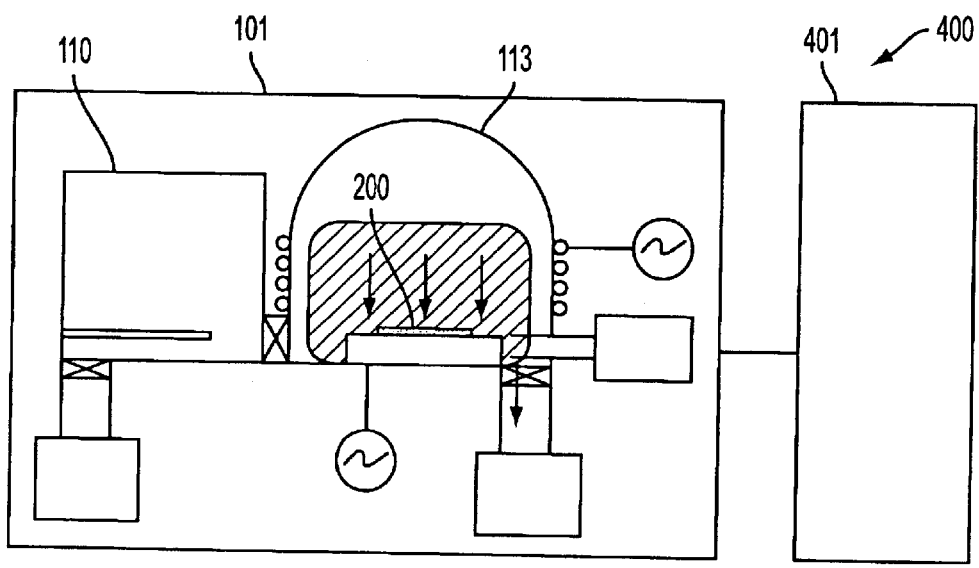

When the circuit-constituting member 200 is transferred into the processing chamber 113, the gate valve 124 is closed again, and the circuit-constituting member 200 is heated by the heating susceptor 129 up to 500° C. The circuit-constituting member 200 is then supplied by the RF power source 130 via the heating susceptor 129 with a high frequency bias at 250 W. Thus, as shown in FIG. 12(c), the plasma acts on the circuit-constituting member 200 so as to conduct dry etching (step S9), any damage layers appearing on the surface of the contact holes (the through holes) 203 through 205 can be removed. Thereafter, similar to the circuit-processing method of the prior art performed by the circuit-processing system 100, the plasma etching treatment is stopped (step S10), and the gate valve 124 is opened to permit the robot arm 122 to transfer the circuit-constituting member 200 from the first processing chamber 113 to the transport chamber 110 (step S11).

In the circuit-processing method of the circuit-processing system 400 of the present embodiment, as described above, the circuit-constituting member 200, which is subjected to the plasma etching treatment in the processing chamber 113, is initially positioned in the transport chamber 110 when the plasma starts to be generated in the processing chamber 113, and is transferred from the transport chamber 110 to the processing chamber 113 after a predetermined time lapse. Therefore, the circuit-constituting member 200 is not subjected to the treatment by plasma immediately after the start of generation thereof, which is of high density and uneven, and thus unstable. Namely, the circuit-constituting member 200 can be subjected to the treatment only by plasma, which is in its stable and even condition due to the predetermined time lapse after the start of generation of the plasma. Accordingly, any excessively large plasma damage does not appear in the circuit-constituting member 200 resulting in that any leakage of electric current from the gate oxide film 211 of MOSFET 202 can be prevented.

A description of a basic principle of the circuit-processing performed by the circuit-processing system 400 of the present embodiment will be provided hereinbelow. To begin with, in the circuit-processing system 100 of the prior art, it was inspected and confirmed that a lot of plasma damage appears in the circuit-constituting member 200 when it is subjected to the plasma etching treatment.

Taking this fact into consideration, the inventor of the present Application investigated the condition of plasma generating in the processing chamber 113 via inspection of the behavior of the ICP power source 128. As a result, it was found that immediately after a time when the ICP power source 128 is turned ON, the plasma cannot be in a stable condition thereof. Particularly, since the plasma is initially generated under a low vacuum environment, the density thereof is very high. It was thus clarified that the high-density, uneven, and unstably generated plasma causes a lot of or excessively large plasma damage on the circuit-constituting member 200. Therefore, in the circuit-processing method performed by the circuit-processing system 400, it was decided that the circuit-constituting member 200 should not be subjected to the treatment by the above-described plasma after the start of generation thereof, which is of high density and uneven. Namely, in the method of the embodiment, as the circuit-constituting member 200 is subjected to the treatment only by the plasma that is brought into a stable and even condition due to a predetermined time lapse, the circuit-constituting member 200 can be subjected to the plasma etching treatment without causing any excessively large plasma damage.

Figure 14:
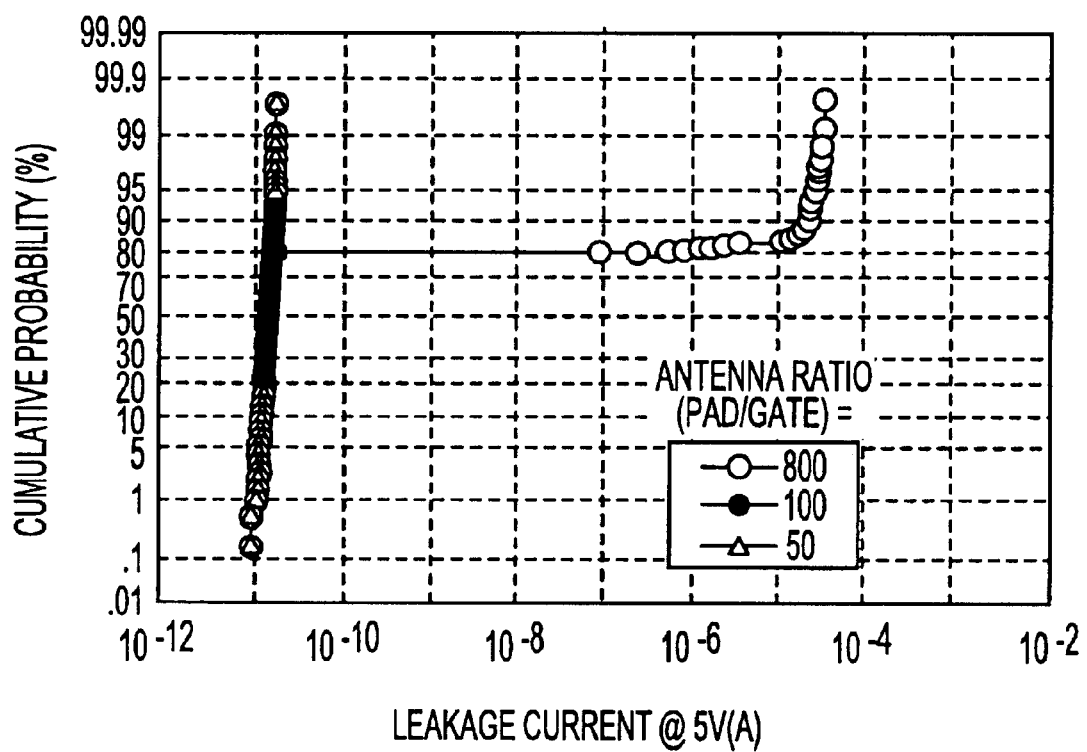
FIG. 14 is a graphical characteristic view indicating the result of the inspection test of the plasma damages using the test specimen.

It should be appreciated that the inventor of the present Application practically produced examples of the above-described circuit-processing system 400 according to the embodiment of the present invention as well as an example of the afore-mentioned test specimen 300 to investigate and inspect the plasma damages appearing in the examples of the test specimen 300 due to the plasma etching treatment. The result of the investigation and inspection is indicated in the graph of FIG. 14. As will be understood from the indication of FIG. 14, it was confirmed that the gate leakage current is incomparably reduced against the prior art in the case of the investigated examples having the antenna ratio of 100 and 50. Further, in the case of the investigated examples having the antenna ratio of 800, the gate leakage current appeared in a part of the examples, but the yield rate has reached to more than 80%. Since the antenna ratio of 800 is a value for investigation purpose only, which is excessively large compared with a real value employed by practical products, the antenna ratio of the practical products can be considered as being fully smaller than 800, and accordingly it can be eventually understood that the circuit-processing system 400 according to the present embodiment is surely able to produce products by the plasma etching treatment without causing any plasma damage to the products. Namely, in the circuit-processing method performed by the circuit-processing system 400 according to the present embodiment, the smaller the antenna ration of the gate region of the MOSFET 202 of the circuit-constituting member 200, the more effectively the plasma damage can be prevented from appearing in the gate oxide film 211.

In the circuit-processing method performed by the circuit-processing system 400 of the present embodiment, like the prior art, the interior of the processing chamber is held at a low vacuum level when generation of plasma starts in the processing chamber 113, and accordingly the plasma can smoothly start to be generated. Nevertheless, when a predetermined time has passed since the start of generation of plasma, the processing chamber 113 is vacuumized to a high vacuum level before the circuit-constituting member 200 is transferred to the processing chamber 113. Thus, the circuit-constituting member 200 is processed by plasma, which is generated in a high vacuum position or region, and is not exposed to various noises, which might occur, together with plasma, in a low vacuum region. Therefore, the circuit-constituting member 200 can be more successfully prevented from being damaged.

Furthermore, in the circuit-processing method performed by the circuit-processing system 400 according to the present embodiment, detection as to whether or not the stable condition of plasma generated in the processing chamber 113 is reached after the start of generation of plasma is conducted by detecting a predetermined time lapse from the start of generation of plasma. Accordingly, detection of the stable condition of plasma can be easily and surely achieved.

It should be appreciated that the present invention is not limited to the described embodiment, and may be varied or modified without departing from the gist of the invention. For example, in the above-described embodiment, when the circuit-constituting member 200 is transferred from the transport chamber 110 to the processing chamber 113, both the transport chamber 110 and the processing chamber 113 are vacuumized to an identical vacuum level. However, the vacuum pump 121 might be controlled by the motion-controlling unit 401, so that when the circuit-constituting member 200 is transferred from the transport chamber 110 to the processing chamber 113, the interior of the transport chamber 110 is held at a finely less vacuum level in comparison with the vacuum level in the processing chamber 113. In this case, the circuit-constituting member 200 is transferred from the member-waiting portion at a low vacuum level to the processing chamber 113 at a high vacuum level. Thus, no transportation of the environment from the processing chamber 113 to the transport chamber 110 occurs, and accordingly plasma generated in the processing chamber 113 does not leak into the transport chamber 110 while preventing occurrence of plasma damage to the circuit-constituting member 200 within the transport chamber 110.

In the described embodiment, although the circuit-constituting member 200 is subjected to the dry plasma etching treatment, the present invention may be applied to various other plasma treatments such as e.g., a plasma enhanced CVD, a plasma doping, a plasma flood gun, a plasma oxidation, a plasma ashing, a plasma cleaning, a plasma descum, a plasma trap and so forth.

In the described embodiment, the transport chamber 110 juxtaposed to the processing chamber 113 for the plasma etching treatment is employed as a position for retracting the processed object, i.e., the circuit-constituting member 200, and thus the software for the motion-controlling unit 102 of the existing circuit-processing system 100 might be used for carrying out the circuit-processing method of the present invention, only if a modification is applied to the software.

In the described embodiment, the circuit-constituting member 200 is subjected to the plasma treatment by the plasma, which is brought into a stable condition thereof due to the predetermined time lapse from the start of generation thereof. Thus, when the plasma that has started to be generated in the processing chamber 113 is brought into its stable condition, the circuit-constituting member 200 waiting for being processed at a retracted position located outside the processing chamber 113 is transferred to the interior of the processing chamber 113. However, another embodiment might be applied in which when the plasma that has started to be generated, the circuit-constituting member 200 is covered against the position in which the plasma is generated. Then, when the plasma that has started to be generated is surely brought into its stable condition, the covering of the circuit-constituting member 200 is removed, so that the circuit-constituting member 200 is processed only by the plasma in its stable condition due to a predetermined time lapse after the start of generation of the plasma.

For example, in an existing circuit-processing system (not shown) performing a plasma enhanced CVD as a plasma treatment, a freely openable shutter member is disposed at an intermediate position between a position where plasma is generated and a different position where a circuit-constituting member is held for waiting, in order to prevent the circuit-constituting member from being subjected to a first CVD treatment by a contaminated plasma source. Therefore, this type of existing circuit-processing system could be employed for carrying out the present invention if a modification is applied to software for operating the motion-controlling unit of the existing system.

In the described embodiment, the stable condition of plasma that has started to be generated in the processing chamber 113 is detected by the detection of a predetermined time lapse after the start of generation of the plasma. However, for example, it is possible to actually monitor the procedure from the start of generation of the plasma to the moment that the plasma comes into its stable condition.

Further, in the described embodiment, the motion-controlling unit 401 is operated according to the control program installed in the form of software in order to perform a various functions for logically realizing the various functioning means. However, it should be appreciated that each of the various functioning means might be formed in a specified hardware. Naturally, it may be possible that each of the functioning means is realized a part by software and the other part by hardware.

In the described embodiment, the software, which is installed into the HDD from a CD-ROM is reproduced by copy into the RAM when the motion-controlling unit 401 is started, and is then read from the RAM by the CPU. However, either a method in which the CPU directly uses the software installed in the HDD without intervention of the RAM or another method in which the software is preliminarily and fixedly stored in the ROM may be employed. Moreover, the software might be stored in either a FD or a CD-ROM, which can be a single information storage unit, so that the software may be installed in the HDD or the RAM of the motion-controlling unit 401. Nevertheless, the CPU of the motion-controlling unit 401 may directly read the software from the FD or the CD-ROM to perform the motion-controlling operation. Namely, it should be understood that when the various functioning means of the motion-controlling unit 401 are realized by software, the software might be stored in any appropriate manner even if the CPU reads the software to perform the motion-controlling operation according to the program of the software. Further, the above-mentioned software for realizing the various functioning means may be formed by a combination of a plurality of software. In this case, the least amount of software necessary for realizing the motion-controlling unit 401 of the present invention should be stored in the information storage medium constituting a single product.

For example, when applications software is provided for the motion-controlling unit 401 in which the existing operating system has been already installed, by the use of an information storage medium such as a CD-ROM, the software for realizing the various functioning means of the motion-controlling unit 401 of the present invention is constituted by a combination of applications software and operating system. Thus, it is possible to omit a part of the software depending on the operating system from the applications software to be stored in the information storage medium.

Further, a method of supplying software described in the information storage medium to the CPU is not limited to the method in which the information storage medium is directly mounted in the motion-controlling unit 401. For example, the above-described software may be stored in an information storage medium of a host computer operatively connected to terminal computers by an appropriate communication network. Then, the software can be supplied to the terminal computers by data communication conducted via the communication network. In this case, the terminal computer will download the software to the information storage medium thereof from the host computer, and will be able to execute the operation of the stand-alone. Nevertheless, the operation may be executed by real-time data communication with the host computer, instead of downloading the software from the host computer. Then, the entire system including the host computer and the terminal computer or computers operatively connected to the host computer by means of the communication network will correspond to the motion-controlling unit 401 according to the present invention.

In the invention as set forth in claims 1, 6, 9, 15, and 18, since the circuit-constituting member is subjected to the predetermined circuit-processing after plasma that has started to be generated is brought into its stable condition, the circuit-constituting member is not processed by plasma in its unstable condition but only by plasma in its stable condition. Accordingly, the circuit-constituting member can be surely and successfully subjected to the plasma treatment due to the stable plasma while the damage to the circuit-constituting member due to the unstable plasma can be prevented.

In the invention as set forth in claims 2 and 12, since the stable condition of plasma is detected by the predetermined time lapse from the start of generation of plasma, the detection as to whether or not the plasma is brought into its stable condition can be simply and surely achieved only by measuring the time lapse.

In the invention as set forth in claims 3, 7, 10, 16, and 19, the circuit-constituting member is initially retracted from a position where plasma starts to be generated, and is transferred to the position where plasma is generated after the plasma that has started to be generated is brought into its stable condition.

Accordingly, the processing of the circuit-constituting member not by the unstable plasma but only by the stable plasma can be simply and surely achieved by the transferring of the circuit-constituting member.

In the invention as set forth in claims 4, 8, 11, 17, and 20, since the circuit-constituting member is initially covered against a position where plasma starts to be generated, and since the circuit-constituting member is uncovered to be processed after the plasma is brought into its stable condition, the processing of the circuit-constituting member not by the unstable plasma but only by the stable plasma can be simply and surely achieved by covering and uncovering of the circuit-constituting member.

In the invention as set forth in claims 5 and 13, since the position where plasma is generated is initially kept at a low vacuum level, the plasma can smoothly start to be generated. Then, the position where the plasma is generated is vacuumized to a high vacuum level after the plasma is brought into its stable condition while permitting the circuit-constituting member to be transferred to the plasma generated position. Accordingly, the circuit-constituting member can be processed only by the stable plasma that is generated in a high vacuum position, and is not exposed to various noises, which appear, together with the plasma in the low vacuum position. Thus, the circuit-constituting member can be surely prevented from being subjected to plasma damage.

In the invention as set forth in claim 14, the circuit-constituting member is transferred from the low vacuum member-waiting portion to the high vacuum plasma-generative portion. Accordingly, no transferring of environment from the plasma-generative portion to the member-waiting portion occurs, and therefore any leakage of the generated plasma from the plasma-generative portion to the member-waiting portion occurs. Thus, occurrence of plasma damage to the circuit-constituting member within the member-waiting portion can be prevented. It should be hereby understood that many variations and modifications to the described preferred embodiments of the present invention will occur to a person skilled in the art without departing from the scope and spirit of the invention as claimed in the accompanying claims.

What is claimed is:

1. A method of performing a predetermined processing for an electric circuit on a circuit-constituting member by employing plasma generated by employing a high frequency electric voltage on specified gases introduced into a vacuum space, comprising the step of:

starting said predetermined processing for said electric circuit on said circuit-constituting member when it is confirmed that said plasma is brought into a stable condition thereof after starting of generation of said plasma, said plasma in said stable condition being of lower and more uniform density than at said starting of generation of said plasma.

2. The method as set forth in claim 1, further comprising the step of:

detecting a predetermined time lapse after the starting of generation of said plasma to thereby confirm that said stable condition of said plasma is reached.

3. A method of performing a predetermined processing for an electric circuit on a circuit-constituting member by employing plasma generated by employing a high frequency electric voltage on specified gases introduced into a vacuum space, comprising the step of:

starting said predetermined processing for said electric circuit on said circuit-constituting member when it is confirmed that said plasma is brought into a stable condition thereof after starting of generation of said plasma, and wherein said method further comprises the steps of:

transferring said circuit-constituting member from a first position where said plasma is generated to a second position where said plasma is not generated before said generation of plasma is started; and returning said circuit-constituting member from said second position to said first position when said stable condition of plasma is reached.

4. A method of performing a predetermined processing for an electric circuit on a circuit-constituting member by employing plasma generated by employing a high frequency electric voltage on specified gases introduced into a vacuum space, comprising the step of:

starting said predetermined processing for said electric circuit on said circuit-constituting member when it is confirmed that said plasma is brought into a stable condition thereof after starting of generation of said plasma, and the step of:

detecting a predetermined time lapse after the starting of generation of said plasma to thereby confirm that said stable condition of said plasma is reached, wherein said method further comprises the steps of:

transferring said circuit-constituting member from a first position where said plasma is generated to a second position where said plasma is not generated before said generation of plasma is started; and returning said circuit-constituting member from said second position to said first position when said stable condition of plasma is reached.

5. A method of performing a predetermined processing for an electric circuit on a circuit-constituting member by employing plasma generated by employing a high frequency electric voltage on specified gases introduced into a vacuum space, comprising the step of:

starting said predetermined processing for said electric circuit on said circuit-constituting member when it is confirmed that said plasma is brought into a stable condition thereof after starting of generation of said plasma, and wherein said method further comprises the steps of:

covering said circuit-constituting member against a position where said plasma is generated before said generation of plasma is started; and uncovering said circuit-constituting member to thereby expose said circuit-constituting member to said plasma at the position where said plasma is generated when said stable condition of plasma is reached.

6. A method of performing a predetermined processing for an electric circuit on a circuit-constituting member by employing plasma generated by employing a high frequency electric voltage on specified gases introduced into a vacuum space, comprising the step of:

starting said predetermined processing for said electric circuit on said circuit-constituting member when it is confirmed that said plasma is brought into a stable condition thereof after starting of generation of said plasma, and the step of:

detecting a predetermined time lapse after the starting of generation of said plasma to thereby confirm that said stable condition of said plasma is reached, wherein said method further comprises the steps of:

covering said circuit-constituting member against a position where said plasma is generated before said generation of plasma is started; and uncovering said circuit-constituting member to thereby expose said circuit-constituting member to said plasma at the position where said plasma is generated when said stable condition of plasma is reached.

7. A method of performing a predetermined processing for an electric circuit on a circuit-constituting member by employing plasma generated by employing a high frequency electric voltage on specified gases introduced into a vacuum space, comprising the step of:

starting said predetermined processing for said electric circuit on said circuit-constituting member when it is confirmed that said plasma is brought into a stable condition thereof after starting of generation of said plasma, and wherein said method further comprises the steps of:

transferring said circuit-constituting member from a first position where said plasma is generated to a second position where said plasma is not generated before said generation of plasma is started;

returning said circuit-constituting member from said second position to said first position when said stable condition of plasma is reached;

vacuumizing said first position to a predetermined low vacuum condition before said generation of plasma is started;

vacuumizing further said first position to a predetermined high vacuum condition; and implementing said returning of said circuit-constituting member from said second position to said first position at the high vacuum condition.

8. A method of performing a predetermined processing for an electric circuit on a circuit-constituting member by employing plasma generated by employing a high frequency electric voltage on specified gases introduced into a vacuum space, comprising the step of:

starting said predetermined processing for said electric circuit on said circuit-constituting member when it is confirmed that said plasma is brought into a stable condition thereof after starting of generation of said plasma, and the step of:

detecting a predetermined time lapse after the starting of generation of said plasma to thereby confirm that said stable condition of said plasma is reached, wherein said method further comprises the steps of:

transferring said circuit-constituting member from a first position where said plasma is generated to a second position where said plasma is not generated before said generation of plasma is started;

returning said circuit-constituting member from said second position to said first position when said stable condition of plasma is reached;

vacuumizing said first position to a predetermined low vacuum condition before said generation of plasma is started;

vacuumizing further said first position to a predetermined high vacuum condition; and implementing said returning of said circuit-constituting member from said second position to said first position at the high vacuum condition.

9. A method of controlling a motion of an apparatus for performing a predetermined processing for an electric circuit on a circuit-constituting member by employing plasma generated by a plasma-generation means which employs a high frequency electric voltage on specified gases introduced into a vacuum space, comprising the steps of:

detecting a stable condition of said plasma by a detecting means when generation of said plasma is started by said plasma generation means; and starting said predetermined processing for said electric circuit on said circuit-constituting member when said detecting means detects that said plasma is brought into a stable condition thereof, said plasma in said stable condition being of lower and more uniform density than at said starting of generation of said plasma.

10. A method of controlling the motion of an apparatus for performing a predetermined processing for an electric circuit on a circuit-constituting member including a hollow plasma generative portion in which plasma is generated, a hollow waiting portion for a processed object consisting of a circuit-constituting member, said portion being operatively connected to the plasma generative portion, and a member-transferring means for supporting thereon said circuit-constituting member and for transferring said processed object to each of said waiting portion and said plasma generative portion, said apparatus for performing said predetermined processing for said electric circuit on said circuit-constituting member by said plasma when said circuit-constituting member is transferred by said member-transferring means from said hollow waiting portion to said plasma generative portion, wherein said controlling method comprises the steps of:

positioning said circuit-constituting member at said hollow waiting portion when generation of said plasma is started in said plasma generative portion; and transferring said circuit-constituting member from said hollow waiting portion to said plasma generative portion by said member-transferring means when said plasma in said plasma generative portion is brought into a stable condition thereof after the starting of generation of said plasma.

11. A method of controlling the motion of an apparatus for performing a predetermined processing for an electric circuit on a circuit-constituting member including a hollow plasma generative portion in which plasma is generated, a plasma generating means for generating plasma at a first predetermined position in said plasma generative portion, a member-holding means for holding said circuit-constituting member at a second predetermined position opposing said first predetermined position in said plasma generative portion, a member-coverage means for applying removable coverage to said circuit-constituting member between said first predetermined position where said plasma is generated by said plasma generating means and said second predetermined position where said circuit-constituting member is held by said member-holding means, said apparatus for performing said predetermined processing for said electric circuit on said circuit-constituting member by said plasma, wherein said controlling method comprises the steps of:

effecting application of said coverage to said circuit-constituting member when generation of said plasma by said plasma generating means is started; and removing said coverage from said circuit-constituting member when said plasma generated by said plasma generating means is brought into a stable condition thereof after the starting of generation of said plasma.

* * * * *